US008893064B1

(12) United States Patent
Lu

(10) Patent No.: US 8,893,064 B1
(45) Date of Patent: Nov. 18, 2014

(54) SYSTEM AND METHOD FOR DETERMINING MERGED RESISTANCE VALUES FOR SAME-TYPE TERMINALS IN A COMPLEX SEMICONDUCTOR STRUCTURE

(71) Applicant: International Business Machines Corporation, Armonk, NY (US)

(72) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/924,710

(22) Filed: Jun. 24, 2013

(51) Int. Cl.
*G06F 17/50* (2006.01)

(52) U.S. Cl.
CPC .................................. *G06F 17/5081* (2013.01)
USPC ............................ 716/106; 716/111; 716/115

(58) Field of Classification Search
CPC ............ G06F 17/5009; G06F 17/5022; G06F 17/5027; G06F 17/5036; G06F 17/5045
USPC .......................................... 716/106–115, 136
See application file for complete search history.

(56) References Cited

U.S. PATENT DOCUMENTS

| | | |
|---|---|---|
| 6,704,911 B2 | 3/2004 | Yang |
| 6,763,504 B2 | 7/2004 | Rao et al. |
| 7,139,990 B2 | 11/2006 | Singh et al. |
| 7,937,678 B2 | 5/2011 | Lippmann et al. |
| 8,392,867 B2 | 3/2013 | Deng et al. |
| 2008/0028353 A1* | 1/2008 | Lu et al. ........................... 716/13 |
| 2008/0066024 A1* | 3/2008 | Mina et al. ........................ 716/4 |
| 2010/0077366 A1 | 3/2010 | Bjesse |
| 2012/0226456 A1 | 9/2012 | Lu |
| 2012/0254820 A1 | 10/2012 | Lu |
| 2013/0024828 A1 | 1/2013 | Lu |

* cited by examiner

*Primary Examiner* — Paul Dinh
(74) *Attorney, Agent, or Firm* — Gibb & Riley, LLC; Anthony J. Canale

(57) ABSTRACT

Disclosed are a system and a method for determining merged resistance values of same-type terminals of multiple electrically connected multi-terminal semiconductor devices (e.g., field effect transistors) in a complex semiconductor structure, wherein all first terminals are connected to a first node, all second terminals are connected to a second node, and all third terminals are connected to a third node. Modified resistor networks are generated from a full resistor network including, but not limited to, a first modified resistor network with shorted second terminals and a second node; a second modified resistor network with shorted first terminals and a first node; and a third modified resistor network with first terminals and first node shorted and with the second terminals and second node shorted. Simulations are performed using the modified resistor networks and, based on the results, merged resistance values for the first, second, and third terminals are determined.

20 Claims, 18 Drawing Sheets

US 8,893,064 B1

SYSTEM AND METHOD FOR DETERMINING MERGED RESISTANCE VALUES FOR SAME-TYPE TERMINALS IN A COMPLEX SEMICONDUCTOR STRUCTURE

BACKGROUND

The system and method disclosed herein relate to integrated circuit performance modeling and, more particularly, to determining merged resistance values for same-type terminals of multiple electrically connected semiconductor devices (e.g., multiple electrically connected field effect transistors (FETs) or multiple electrically connected bipolar junction transistors (BJTs)) in a complex semiconductor structure so that such merged resistance values can subsequently be used in integrated circuit performance modeling.

Traditional techniques for generating a performance model for an integrated circuit (i.e., a model of integrated circuit behavioral characteristics, current-voltage (I-V) characteristics, etc.) require extraction of a full netlist from the design layout of the integrated circuit. This full netlist will include all active devices and many parasitic resistive elements. Examples of parasitic resistive elements include diffusion resistance, contact resistance, local interconnect resistance, via resistance, metal wire resistance, etc. The values of these parasitic resistance elements are temperature dependent but are voltage independent generally (or, say, in their intended operational voltage range). The behavior of active devices is both temperature-dependent and voltage-dependent. Simulations of the full netlist are performed over the full range of operating temperatures, over the full range of operating power supply voltages and, optionally, taking into consideration other factors that may impact performance (e.g., self-heating and stress). Additionally, repeated simulations may be required for model calibration and/or to accommodate design modifications or options. The integrated circuit performance model can be generated based on the results of the simulations.

Unfortunately, as more and more complex semiconductor structures having multiple electrically connected multi-terminal semiconductor devices are incorporated into integrated circuits the use of such traditional techniques to model integrated circuit performance has become impracticable, given the amount of time required to complete the simulations and generate the integrated circuit performance model.

SUMMARY

In view of the foregoing, disclosed herein are a system, method and computer program product for determining merged resistance values of same-type terminals of multiple electrically connected multi-terminal semiconductor devices in a complex semiconductor structure. Specifically, the complex semiconductor structure can comprise multiple electrically connected field effect transistors (FETs) each having a first terminal (a source), a second terminal (a drain) and a third terminal (a gate). Alternatively, the complex semiconductor structure can comprise multiple electrically connected bipolar junction transistors (BJTs) each having a first terminal (an emitter), a second terminal (a collector) and a third terminal (a base). In any case, all of the first terminals of the semiconductor devices can be electrically connected to a same first node by first interconnects, all of the second terminals of the semiconductor devices can be electrically connected to a same second node by a second interconnects, and all of the third terminals of the semiconductor devices can be electrically connected to a same third node by a third interconnects.

To determine the merged resistance values, multiple modified resistor networks can be generated based on a full resistor network for the structure including, but not limited to, a first modified resistor network where the second terminals of the semiconductor devices and the second node are electrically shorted; a second modified resistor network where the first terminals of the semiconductor devices and the first node are electrically shorted; and a third modified resistor network where the first terminals of the semiconductor devices and the first node are electrically shorted and where the second terminals of the semiconductor devices and the second node are also electrically shorted. Multiple simulations can be performed using these modified resistor networks. Based on the results of the simulations, a first merged resistance value associated with the first terminals of the devices, a second merged resistance value associated with the second terminals of the devices, and a third merged resistance value associated with the third terminals of the devices can be determined. These merged resistance values can subsequently be set as the resistance values for parasitic resistive elements connected to the terminals of a simple semiconductor device in a merged netlist representative of the complex semiconductor structure and this merged netlist can be used to generate a provisional performance model for an integrated circuit that incorporates the complex semiconductor structure. Thus, the disclosed system, method and computer program product enable faster integrated circuit simulations and model development without any loss of accuracy.

More particularly, disclosed herein is a system for determining merged resistance values of same-type terminals of multiple electrically connected multi-terminal semiconductor devices in a complex semiconductor structure. The system can comprise a memory and one or more processors in communication with the memory.

The memory can store a design for the complex semiconductor structure. This complex semiconductor structure can comprise multiple electrically connected multi-terminal semiconductor devices. For example, the complex semiconductor structure can comprise multiple electrically connected field effect transistors (FETs) each having a first terminal (a source), a second terminal (a drain) and a third terminal (a gate). Alternatively, the complex semiconductor structure can comprise multiple electrically connected bipolar junction transistors (BJTs) each having a first terminal (an emitter), a second terminal (a collector) and a third terminal (a base). In any case, all of the first terminals of the semiconductor devices can be electrically connected to a first node by first interconnects, all of the second terminals of the semiconductor devices can be electrically connected to a second node by a second interconnects, and all of the third terminals of the semiconductor devices can be electrically connected to a third node by a third interconnects.

The processor(s) can access the design in the memory and can determine merged resistance values for all same-type terminals (i.e., for all first terminals, all second terminals and all third terminals) of the semiconductor devices in the complex semiconductor structure, as follows. Specifically, the processor(s) can comprise a plurality of tools including, but not limited to, a parasitic extraction tool and a simulation tool.

The parasitic extraction tool can generate a full resistor network for the complex semiconductor structure and the parasitic extraction tool can modify the full resistor network multiple discrete times to generate multiple discrete modified resistor networks including, but not limited to, a first modified resistor network, a second modified resistor network and a third modified resistor network. In any case, within the first modified resistor network all of the second terminals of the semiconductor devices and the second node (e.g., all of the drains and the drain node in the case of FETs) can be electrically shorted together. Within the second modified resistor network all of the first terminals of the semiconductor devices and the first node (e.g., all of the sources and the source node in the case of FETs) can be electrically shorted together. Within the third modified resistor network all of the first terminals of the semiconductor devices and the first node (e.g., all of the sources and the source node in the case of FETs) can be electrically shorted together and, additionally, all of the second terminals of all of the semiconductor devices and the second node (e.g., all of the drains and the drain the case of FETs) can be also electrically shorted together.

The simulation tool can perform multiple discrete simulations using these discrete modified resistor networks, respectively, and can use the results to determine the merged resistance values for the same-type terminals (i.e., a first merged resistance value associated with all the first terminals, a second merged resistance value associated with all of the second terminals and a third merged resistance value associated with all of the third terminals, respectively) of the semiconductor devices in the complex semiconductor structure. Specifically, the simulation tool can perform at least a first simulation using the first modified resistor network to obtain a first result, a second simulation using the second modified resistor network to obtain a second result, and a third simulation using the third modified resistor network to obtain a third result. The simulation tool can further determine the first merged resistance value associated with the first terminals based on the first result, the second merged resistance value associated with the second terminals based on the second result, and the third merged resistance value associated with the third terminals based on the third result.

It should be noted that, depending upon the embodiment, the parasitic extraction tool must modify the full resistor network to generate one or more additional modified resistor networks and/or the simulator tool must perform one or more additional simulation processes in order to ultimately determine these merged resistance values.

For example, in one embodiment, before the first merged resistance value associated with all of the first terminals of the semiconductor devices (e.g., all of the sources in the case of FETs) and the second merged resistance value associated with all of the second terminals of the semiconductor device (e.g., all of the drains in the case of FETs) can be determined, the parasitic extraction tool can also modify the full resistor network to generate an additional modified resistor network wherein the first terminals and the first node are electrically shorted, the second terminals and the second node are electrically shorted and the third terminals and the third node are electrically shorted. Additionally, the simulation tool can perform an additional simulation using the additional modified resistor network to obtain an additional result. In this case, the first simulation, the second simulation and the additional simulation can comprise DC simulations and the first result of the first simulation can comprise a first resistance value in the absence of second terminal resistance (e.g., in the absence of drain resistance in the case of FETs), the second result of the second simulation can comprise a second resistance value in the absence of first terminal resistance (e.g., in the absence of source resistance in the case of FETs), and the additional result of the additional simulation can comprise an additional resistance value (e.g., a channel resistance value in the case of FETs in the absence of source, drain and gate resistance). The simulation tool can then determine the first merged resistance value associated with all of the first terminals of the semiconductor devices (e.g., all of the sources in the case of FETs) by subtracting the additional resistance value from the first resistance value and can determine the second merged resistance value associated with all of the second terminals of the semiconductor devices (e.g., all of the drains in the case of FETs) by subtracting the additional resistance value from the second resistance value.

Alternatively, in another embodiment, in order to determine the first merged resistance value associated with all of the first terminals of the semiconductor devices (e.g., all of the sources in the case of FETs) and the second merged resistance value associated with all of the second terminals of the semiconductor device (e.g., all of the drains in the case of FETs), the parasitic extraction tool can modify the full resistor network such that, within the first modified resistor network, the semiconductor devices are replaced with first resistors having a first preset resistance and such that, within the second modified resistor network, the semiconductor devices are replaced with second resistors having a second preset resistance. In this case, the first and second simulations can comprise DC simulations and the first and second results can comprise first and second current values (i.e., source and drain current values), respectively. Once the first and second current values are obtained, the simulation tool can determine the first merged resistance value based on a first voltage difference between the second terminals and the first terminals, the first current value, the first preset resistance and a total number of the semiconductor device and can determine the second merged resistance value based on a second voltage difference between the second terminals and the first terminals, the second current value, the second preset resistance and the total number of the semiconductor devices.

Regardless of which of the above described techniques are used to determine the first merged resistance value and the second merged resistance value, a third merged resistance value associated with all of the third terminals of the semiconductor devices (e.g., all of the gates in the case of FETs) must also be determined.

To accomplish this, in one embodiment, the parasitic extraction tool can further modify the full resistor network to generate an additional modified resistor network (as discussed above) wherein the first terminals and the first node are electrically shorted, the second terminals and the second node are electrically shorted and the third terminals and the third node are electrically shorted. Additionally, the simulation tool can perform an additional simulation using the additional modified resistor network to obtain an additional result. In this case, the additional simulation and the third simulation can comprise AC simulations such that the additional result comprises a first admittance value and the third result comprises a second admittance value. The simulation tool can then determine a first impedance value based on the first admittance value and a first effective resistance value based on the first impedance value, where the first effective resistance value is an intrinsic device resistance. The simulation tool can also determine a second impedance value based on the second admittance value and a second effective resistance value based on the second impedance value, where the second effective resistance value is the sum of the intrinsic device resistance and the third merged resistance value associated with the third terminals. Finally, the simulation tool can calculate the third merged resistance value by subtracting the first effect resistance value from the second effective resistance value.

Alternatively, in another embodiment, instead of modifying the full resistor network to generate an additional modified resistor network and performing an additional simulation, the parasitic extraction tool can modify the full resistor network such that, within the third modified resistor network, the semiconductor devices are replaced by capacitors. In this case, the third simulation can comprise an AC simulation and the third result can comprise an admittance value. The simulation tool can then determine an impedance value based on the admittance value and can further determine the third merged resistance value associated with the third terminals based on the impedance value.

Also disclosed herein is a method for determining merged resistance values of same-type terminals of multiple electrically connected multi-terminal semiconductor devices in a complex semiconductor structure.

The method can comprise accessing, by a computer system and, particularly, by one or more processors thereof, a design for the complex semiconductor structure stored in memory. The processor(s) can comprise at least a parasitic extraction tool and a simulation tool. The complex semiconductor structure can comprise multiple electrically connected multi-terminal semiconductor devices and, particularly, multiple electrically connected three-terminal semiconductor devices, such as field effect transistors (FETs) with a multi-finger gate structure or bipolar junction transistors (BJTs) with a multi-finger base structure. The semiconductor devices can each have a first terminal (e.g., a source in the case of a FET or an emitter in the case of a BJT), a second terminal (e.g., a drain in the case of a FET or a collector in the case of a BJT), and a third terminal (e.g., a gate in the case of a FET or a base in the case of a BJT). In any case, all of the first terminals of the semiconductor devices can be electrically connected to a first node by first interconnects, all of the second terminals of the semiconductor devices can be electrically connected to a second node by a second interconnects, and all of the third terminals of the semiconductor devices can be electrically connected to a third node by a third interconnects.

The method can further comprise determining, by the computer system and, particularly, by the processor(s) thereof, merged resistance values for all same-type terminals (i.e., for all first terminals, all second terminals and all third terminals) of the semiconductor devices in the complex semiconductor structure, as follows. Specifically, the method can comprise generating (e.g., by computer system and, particularly, by the parasitic extraction tool thereof) a full resistor network for the complex semiconductor structure. The full resistor network can subsequently be modified (e.g., by the computer system and, particularly, by the parasitic extraction tool thereof) multiple discrete times to generate multiple discrete modified resistor networks including, but not limited to, a first modified resistor network, a second modified resistor network and a third modified resistor network. In any case, within the first modified resistor network all of the second terminals of the semiconductor devices and the second node (e.g., all of the drains and the drain node in the case of FETs) can be electrically shorted together. Within the second modified resistor network all of the first terminals of the semiconductor devices and the first node (e.g., all of the sources and the source node in the case of FETs) can be electrically shorted together. Within the third modified resistor network all of the first terminals of the semiconductor devices and the first node (e.g., all of the sources and the source node in the case of FETs) can be electrically shorted together and, additionally, all of the second terminals of all of the semiconductor devices and the second node (e.g., all of the drains and the drain node in the case of FETs) can be also electrically shorted together.

The method can further comprise performing (e.g., by the computer system and, particularly, by the simulation tool thereof) multiple discrete simulations these discrete modified resistor networks, respectively, and using the results to determine the merged resistance values for the same-type terminals (i.e., a first merged resistance value associated with all the first terminals, a second merged resistance value associated with all of the second terminals and a third merged resistance value associated with all of the third terminals, respectively) of the semiconductor devices in the complex semiconductor structure. These multiple simulations can comprise at least a first simulation using the first modified resistor network to obtain a first result, a second simulation using the second modified resistor network to obtain a second result, and a third simulation using the third modified resistor network to obtain a third result.

Finally, the method can comprise determining (e.g., by the computer system and, particularly, by the simulation tool thereof) the first merged resistance value associated with the first terminals based on the first result, the second merged resistance value associated with the second terminals based on the second result, and the third merged resistance value associated with the third terminals based on the third result.

It should be noted that, depending upon the embodiment, the full resistor network can further be modified to generate one or more additional modified resistor networks and/or one or more additional simulation processes can be performed in order to ultimately determine these merged resistance values.

For example, in one embodiment, before the first merged resistance value associated with all of the first terminals of the semiconductor devices (e.g., all of the sources in the case of FETs) and the second merged resistance value associated with all of the second terminals of the semiconductor device (e.g., all of the drains in the case of FETs) can be determined, the full resistor network can also be modified (e.g., by the computer system and, particularly, by the parasitic extraction tool thereof) to generate an additional modified resistor network wherein the first terminals and the first node are electrically shorted, the second terminals and the second node are electrically shorted and the third terminals and the third node are electrically shorted. Additionally, an additional simulation can be performed (e.g., by the computer system and, particularly, by the simulation tool thereof) using the additional modified resistor network to obtain an additional result. In this case, the first simulation, the second simulation and the additional simulation can comprise DC simulations and the first result of the first simulation can comprise a first resistance value in the absence of second terminal resistance (e.g., in the absence of drain resistance in the case of FETs), the second result of the second simulation can comprise a second resistance value in the absence of first terminal resistance (e.g., in the absence of source resistance in the case of FETs), and the additional result of the additional simulation can comprise an additional resistance value (e.g., a channel resistance value in the case of FETs in the absence of source, drain and gate resistance). Once the first resistance value, second resistance value and additional resistance value are obtained, the first merged resistance value associated with all of the first terminals of the semiconductor devices (e.g., all of the sources in the case of FETs) can be determined by subtracting the additional resistance value from the first resistance value and the second merged resistance value associated with all of the second terminals of the semiconductor devices (e.g., all of the drains in the case of FETs) can be determined by subtracting the additional resistance value from the second resistance value.

Alternatively, in another embodiment, in order to determine the first merged resistance value associated with all of the first terminals of the semiconductor devices (e.g., all of the sources in the case of FETs) and the second merged resistance value associated with all of the second terminals of the semiconductor device (e.g., all of the drains in the case of FETs), the full resistor network can be modified such that, within the first modified resistor network, the semiconductor devices are replaced with first resistors having a first preset resistance and such that, within the second modified resistor network, the semiconductor devices are replaced with second resistors having a second preset resistance. In this case, the first and second simulations can comprise DC simulations and the first and second results can comprise first and second current values (i.e., source and drain current values), respectively. Once the first and second current values are obtained, the first merged resistance value can be determined based on a first voltage difference between the second terminals and the first terminals, the first current value, the first preset resistance and a total number of the semiconductor device and the second merged resistance value can be determined based on a second voltage difference between the second terminals and the first terminals, the second current value, the second preset resistance and the total number of the semiconductor devices.

Regardless of which of the above described techniques are used to determine the first merged resistance value and the second merged resistance value, a third merged resistance value associated with all of the third terminals of the semiconductor devices (e.g., all of the gates in the case of FETs) must also be determined.

To accomplish this, in one embodiment, the full resistor network can also be modified (e.g., by the computer system and, particularly, by the parasitic extraction tool thereof) to generate an additional modified resistor network (as discussed above) wherein the first terminals and the first node are electrically shorted, the second terminals and the second node are electrically shorted and the third terminals and the third node are electrically shorted. Additionally, an additional simulation can be performed (e.g., by the computer system and, particularly, by the simulation tool thereof) using the additional modified resistor network to obtain an additional result. In this case, the additional simulation and the third simulation can comprise AC simulations such that the additional result comprises a first admittance value and the third result comprises a second admittance value. The method can then comprise determining a first impedance value based on the first admittance value; determining a first effective resistance value based on the first impedance value, where the first effective resistance value is an intrinsic device resistance; determining a second impedance value based on the second admittance value; and determining a second effective resistance value based on the second impedance value, where the second effective resistance value is the sum of the intrinsic device resistance and the third merged resistance value associated with the third terminals. Finally, the third merged resistance value can be calculated by subtracting the first effect resistance value from the second effective resistance value.

Alternatively, in another embodiment, instead of modifying the full resistor network to generate an additional modified resistor network and performing an additional simulation, the full resistor network can be modified such that, within the third modified resistor network, the semiconductor devices are replaced by capacitors. In this case, the third simulation can comprise an AC simulation and the third result can comprise an admittance value. The method can then comprise determining an impedance value based on the admittance value and the third merged resistance value associated with the third terminals based on the impedance value.

Also disclosed herein is a computer program product. This computer program product can comprise a computer readable storage medium, which stores instructions executable by a computer to perform the above-described method for determining merged resistance values of same-type terminals of multiple electrically connected multi-terminal semiconductor devices in a complex semiconductor structure.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
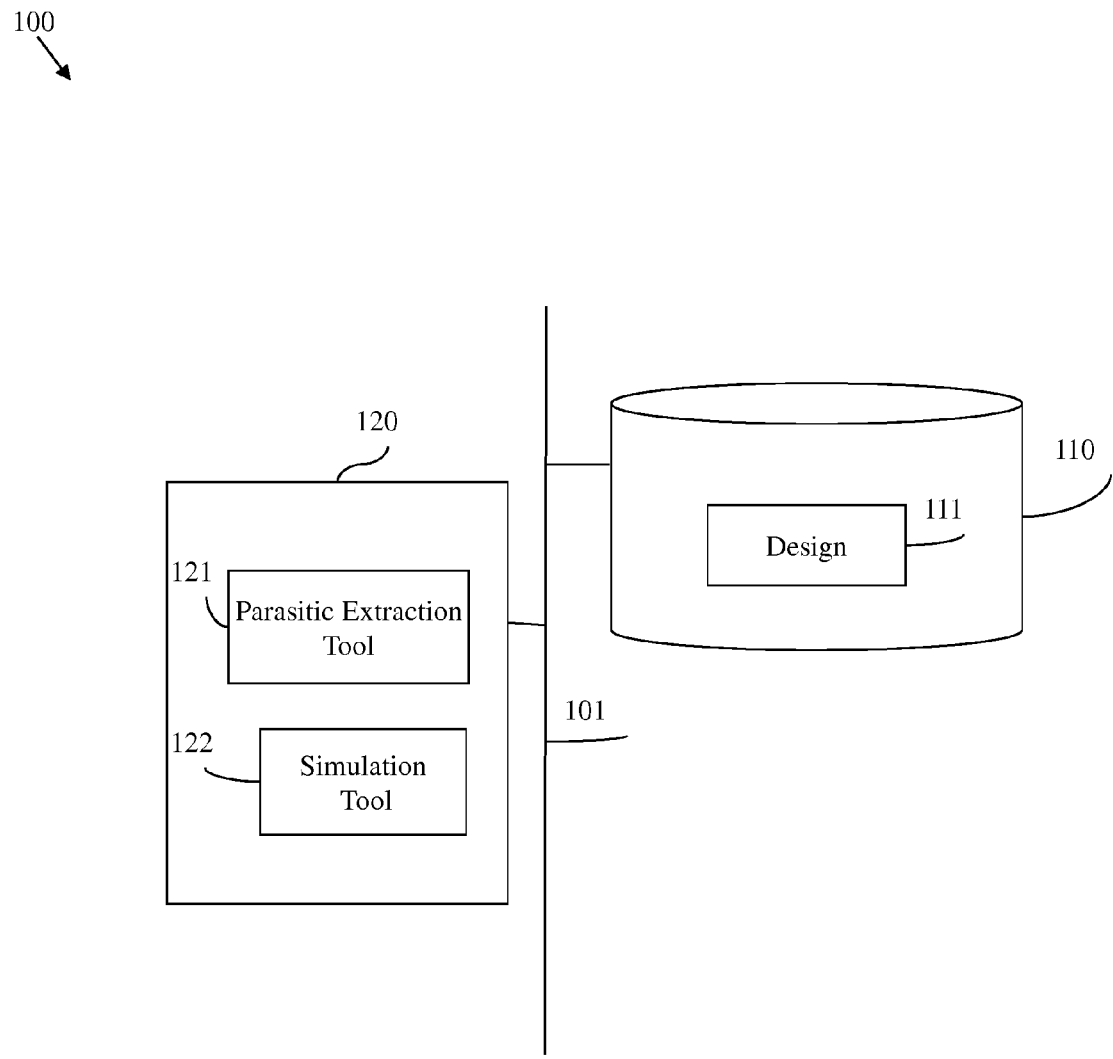
FIG. 1 is a schematic drawing illustrating a system for determining merged resistance values of same-type terminals of multiple electrically connected multi-terminal semiconductor devices in a complex semiconductor structure.

As mentioned above, traditional techniques for generating a performance model for an integrated circuit (i.e., a model of integrated circuit behavioral characteristics, current-voltage (I-V) characteristics, etc.) require extraction of a full netlist from the design layout of the integrated circuit. This full netlist will include all active devices and many parasitic resistive elements. Examples of parasitic resistive elements include diffusion resistance, contact resistance, local interconnect resistance, via resistance, metal wire resistance, etc. The values of these parasitic resistance elements are temperature dependent but are voltage independent generally (or, say, in their intended operational voltage range). The behavior of active devices is both temperature-dependent and voltage-dependent. Simulations of the full netlist are performed over the full range of operating temperatures, over the full range of operating power supply voltages and, optionally, taking into consideration other factors that may impact performance (e.g., self-heating and stress). Additionally, repeated simulations may be required for model calibration and/or to accommodate design modifications or options. The integrated circuit performance model can be generated based on the results of the simulations.

Recently, more and more complex semiconductor structures have been incorporated into integrated circuit designs. A complex semiconductor structure can comprise multiple electrically connected multi-terminal semiconductor devices (e.g., multiple electrically connected field effect transistors (FETs) having a multi-fingered gate structure or multiple electrically connected bipolar junction transistors (BJTs) having a multi-fingered base structure). Unfortunately, with the incorporating of such complex semiconductor structures into integrated circuit designs the use of the traditional techniques to model integrated circuit performance has become impracticable, given the amount of time required to complete the simulations and generate the integrated circuit performance model.

In view of the foregoing, disclosed herein are a system, method and computer program product for determining merged resistance values of same-type terminals of multiple electrically connected multi-terminal semiconductor devices in a complex semiconductor structure. Specifically, the complex semiconductor structure can comprise multiple electrically connected field effect transistors (FETs) each having a first terminal (a source), a second terminal (a drain) and a third terminal (a gate). Alternatively, the complex semiconductor structure can comprise multiple electrically connected bipolar junction transistors (BJTs) each having a first terminal (an emitter), a second terminal (a collector) and a third terminal (a base). In any case, all of the first terminals of the semiconductor devices can be electrically connected to a same first node by first interconnects, all of the second terminals of the semiconductor devices can be electrically connected to a same second node by a second interconnects, and all of the third terminals of the semiconductor devices can be electrically connected to a same third node by a third interconnects. To determine the merged resistance values, multiple modified resistor networks can be generated based on a full resistor network for the structure including, but not limited to, a first modified resistor network where the second terminals of the semiconductor devices and the second node are electrically shorted; a second modified resistor network where the first terminals of the semiconductor devices and the first node are electrically shorted; and a third modified resistor network where the first terminals and the first node are electrically shorted and where the second terminals and the second node are also electrically shorted. Multiple simulations can be performed using these modified resistor networks. Based on the results of the simulations, a first merged resistance value associated with the first terminals of the devices, a second merged resistance value associated with the second terminals of the devices, and a third merged resistance value associated with the third terminals of the devices can be determined. These merged resistance values can subsequently be set as the resistance values for parasitic resistive elements connected to the terminals of a simple semiconductor device in a merged netlist representative of the complex semiconductor structure and this merged netlist can be used to generate a provisional performance model for an integrated circuit that incorporates the complex semiconductor structure. Thus, the disclosed system, method and computer program product enable faster integrated circuit simulations and model development without any loss of accuracy.

Referring to FIG. 1, disclosed herein is a system 100 for determining merged resistance values (i.e., total combined resistance values) of same-type terminals of multiple electrically connected multi-terminal semiconductor devices in a complex semiconductor structure. These merged resistance values can subsequently be set as the resistance values for parasitic resistors connected to the terminals of a simple semiconductor device in a merged netlist representative of the complex semiconductor structure and this merged netlist can be used to generate a provisional performance model for an integrated circuit that incorporates the complex semiconductor structure.

Specifically, the system 100 can comprise a computer system comprising a memory 110 (e.g., at least one data storage device) and one or more processors 120 in communication with the memory 110 (e.g., over a system bus 101 or wired or wireless network). An exemplary computer system capable of implementing the system 100 is described in detail below and illustrated in FIG. 19.

The memory 110 can store (i.e., can be adapted to store, can be configured to store, etc.) a design 111 for a complex semiconductor structure. For purposes of this disclosure, a complex semiconductor structure refers to a semiconductor structure comprising multiple electrically connected semiconductor devices (e.g., multiple electrically connected field effect transistors (FETs) with a multi-finger gate structure or multiple electrically connected bipolar junction transistors (BJTs) with a multi-finger base structure). In any case, the semiconductor devices can each comprise multiple terminals. For example, in the case of a complex semiconductor structure comprising multiple electrically connected FETs, each FET can comprise a first terminal (e.g., the source), a second terminal (e.g., the drain) and a third terminal (e.g., the gate). In the case of a complex semiconductor structure comprising multiple electrically connected BJTs, each BJT can comprise a first terminal (e.g., the emitter), a second terminal (e.g., the collector) and a third terminal (e.g., the base). Additionally, all same-type terminals can be electrically connected by interconnects to a same node. That is, all of the first terminals of the semiconductor devices (e.g., all sources of the FETs or all emitters of the BJTs) can be electrically connected by one or more first interconnects to a first node, all of the second terminals of the semiconductor devices (e.g., all drains of the FETs or all collectors of the BJTs) can be electrically connected by one or more second interconnects to a second node, and all of the third terminals of the semiconductor devices (e.g., all gates of the FETs or all bases of the BJTs) can be electrically connected to by one or more third interconnects to a third node.

It should be understood that the term "field effect transistor" is not intended to be limiting. That is, the term "field effect transistor" refers to, not only a conventional planar field effect transistor, but also to any other type of field effect transistor (e.g., a fin-type field effect transistor, a tri-gate field effect transistor, etc.). It should further be understood that the term "bipolar junction transistor" is also not intended to be limiting. That is, the term "bipolar junction transistor" refers to, not only a conventional collector-down bipolar junction transistor, but also to any other type of bipolar junction transistor (e.g., a collector-up bipolar junction transistor, a heterojunction bipolar transistor, etc.).

Figure 2:
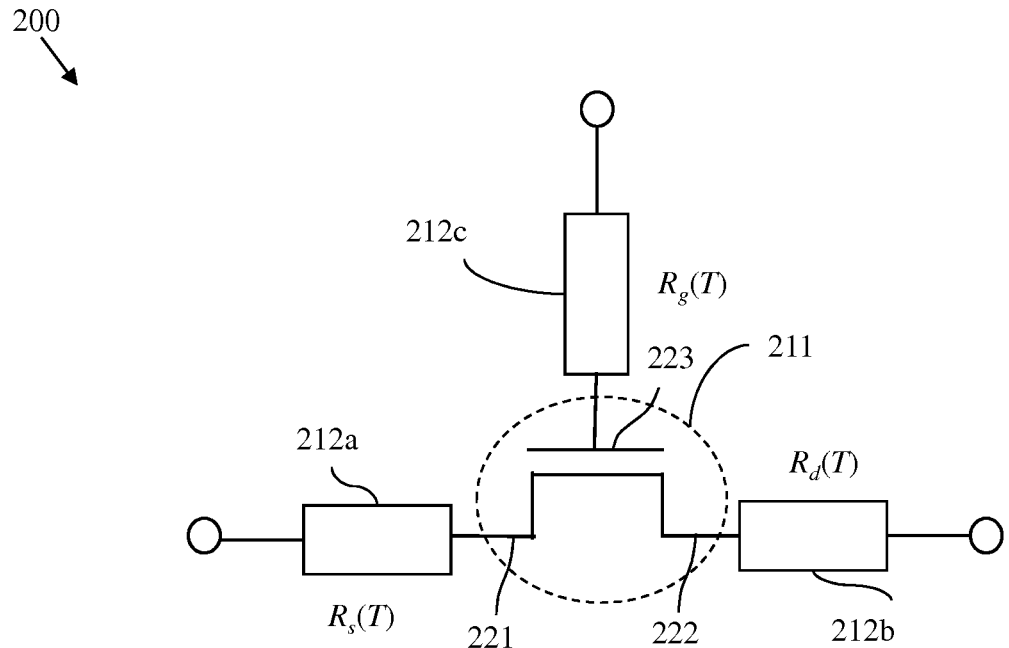
FIG. 2 is a drawing illustrating a merged netlist for a complex semiconductor structure comprising multiple electrically connected field effect transistors.
Figure 3:
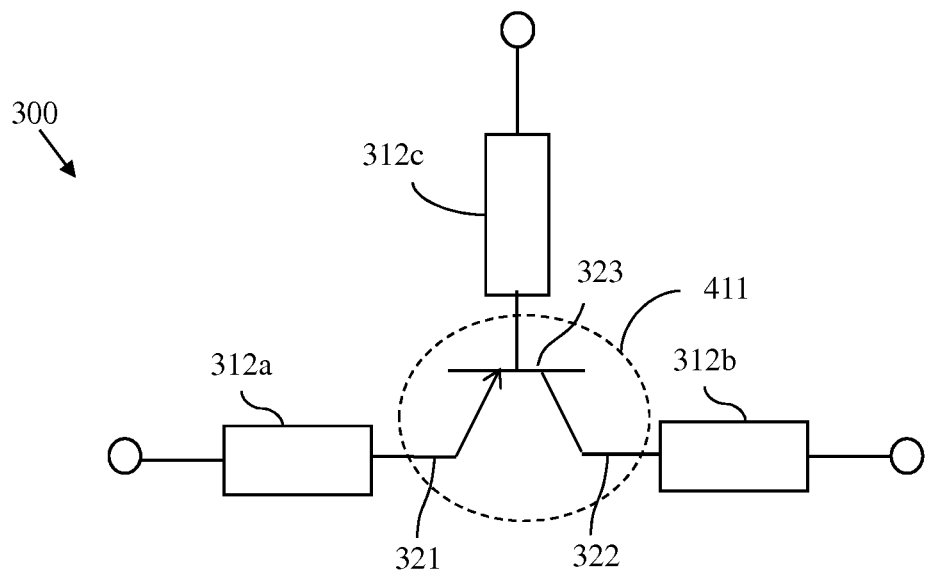
FIG. 3 is a drawing illustrating a merged netlist for a complex semiconductor structure comprising multiple electrically connected bipolar junction transistors.

A complex semiconductor structure, such as those described above, can be represented during integrated circuit modeling by a merged netlist, which comprises a simple semiconductor device and parasitic resistors connected to the terminals of that simple semiconductor device. For example, referring to FIG. 2, a merged netlist 200 for a complex semiconductor structure comprising multiple electrically connected FETs can comprise a single FET 211 with parasitic resistors 212a-c electrically connected in series to the three terminals of the FET 211 (i.e., to the source 221, drain 222 and gate 223, respectively). Referring to FIG. 3, a merged netlist 300 for a complex semiconductor structure comprising multiple electrically connected BJTs can comprise a single BJT 311 with parasitic resistors 312a-c electrically connected in series to the three terminals of the BJT 311 (i.e., to the emitter 321, collector 322 and base 323, respectively). Similar netlists are disclosed in U.S. Pat. No. 8,392,867 of Deng et al. issued on Mar. 5, 2013, assigned to International Business Machines Corporation and incorporated herein by reference.

The system 100 disclosed herein can determine (i.e., can be adapted to determine, can be configured to determine, etc.) the resistance values at which the parasitic resistors 212a-c, 312a-c in such merged netlists 200, 300 should be set. That is, the processor(s) 120 of the system 100 can access the design 111 for the complex semiconductor structure from the memory 110 and can determine the merged resistance values (i.e., total combined resistance values) for same-type terminals (i.e., for all first terminals, all second terminals and all third terminals) of the semiconductor devices in that complex semiconductor structure.

Figure 4:
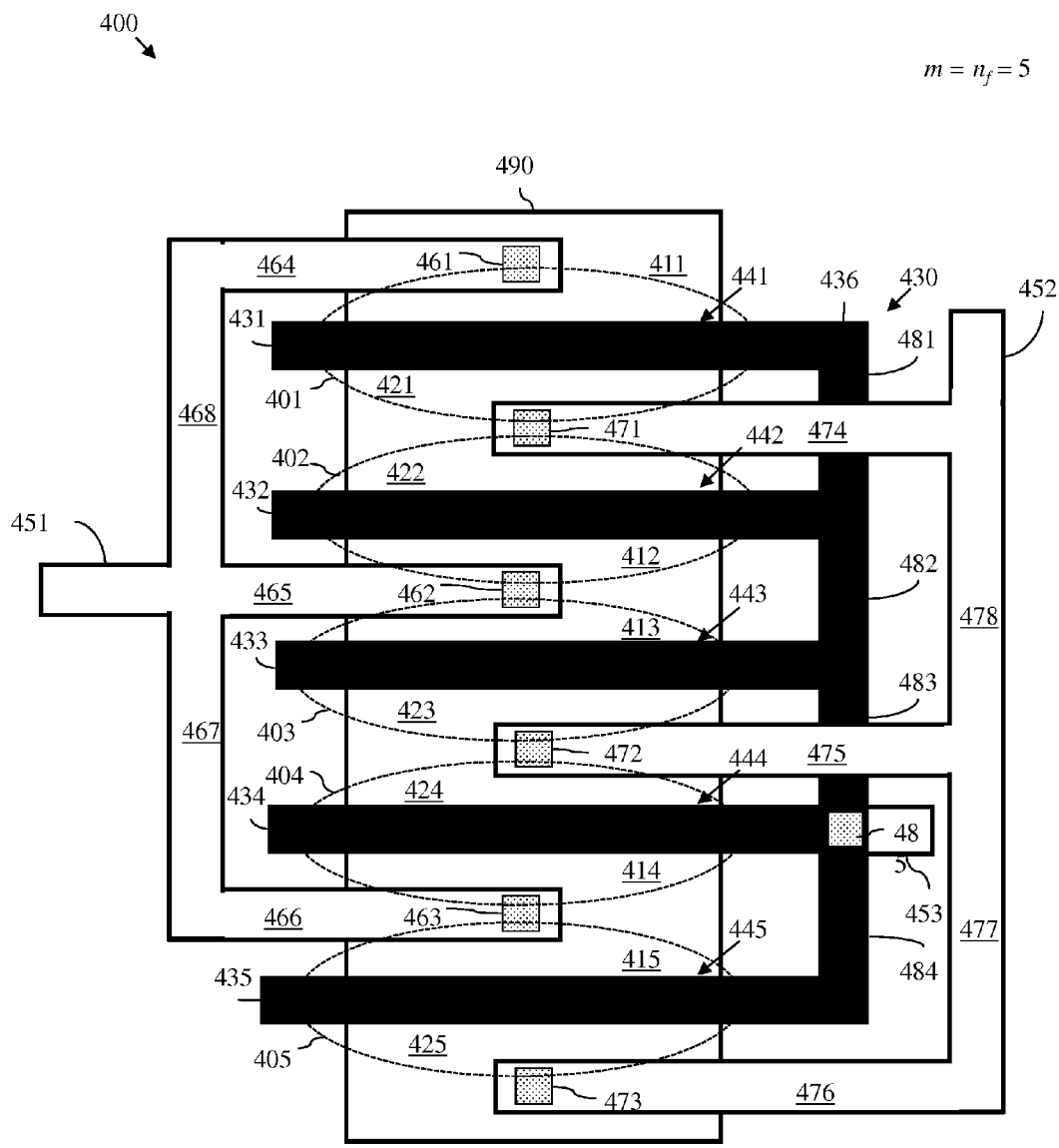
FIG. 4 is a top view diagram illustrating an exemplary complex semiconductor structure comprising multiple electrically connected FETs with a multi-finger gate structure.

For illustration purposes, the processes performed by the processor(s) 120 of the system 100 of FIG. 1 are described below with respect to the exemplary complex semiconductor structure 400 of FIG. 4. FIG. 4 is a top view diagram illustrating an exemplary complex semiconductor structure 400 comprising multiple electrically connected FETs 401-405 with a multi-finger gate structure 430.

This complex semiconductor structure 400 can comprise a semiconductor body 490. The semiconductor body 490 can comprise multiple diffusion regions. These diffusion regions can comprise first terminals 411-415 (i.e., sources, also referred to herein as internal sources) connected by first interconnects 461-468 to a first node 451 (i.e., a source node, also referred to herein as an external source) and second terminals 421-425 (i.e., drains, also referred to herein as internal sources) connected by second interconnects 471-478 to a second node 452 (i.e., a drain node, also referred to herein as an external source). The first interconnects 461-468 can comprise a combination of first contacts 461-463 and first wire segments 464-468 and, similarly, the second interconnects 471-478 can comprise a combination of second contacts 471-473 and second wire segments 474-478. The semiconductor body 490 can further comprise multiple channels 441-445 corresponding to each of the FET 401-405 and each channel can be positioned laterally between two diffusion regions. For example, as illustrated, channel 441 of FET 401 can be positioned laterally between source 411 and drain 421; channel 442 of FET 402 can be positioned laterally between drain 422 and source 412; and so on. Furthermore, the layout of sources and drains within the semiconductor body 490 can be such that two sources or two drains abut each other between adjacent channel regions and are connected by a shared contact. For example, as illustrated, the drains 421 and 422 abut each other between the channels 441 and 442 for FETs 401 and 402 and are contacted by shared contact 471; the sources 412 and 413 abut each other between channels 442 and 443 for FETs 402 and 403 and are contacted by shared contact 462; and so on.

This complex semiconductor structure 400 can further comprise a plurality of third terminals 431-435 (i.e., gates, also referred to as gate fingers or gate extensions) extending laterally across the semiconductor body 490. Each gate 431-435 can be positioned adjacent to (i.e., on, above, etc.) a corresponding channel 441-445 of a corresponding FET 401-405 and, thereby between a first terminal (i.e., a source) and a second terminal (i.e., a drain). The third terminals 441-445 (i.e., gates) can be electrically connected by third interconnects 481-485 to a third node 453 (i.e., a gate node). The third interconnects 481-485 can comprise a combination of gate segments 481-484 of an additional gate body 436, which traverses and is in contact with the third terminals 431-435 at one end (as shown), and at least one contact 485. Alternatively, the third interconnects 481-485 can comprise a combination of third contacts and third wires segments (not shown).

It should be understood that the complex semiconductor structure 400 of FIG. 4 is just one example of a complex semiconductor structure for which the system 100 disclosed herein can be used to determine merged resistance values of same-type terminals and is not intended to be limiting. For example, for purposes of illustration, this complex semiconductor structure 400 is shown as comprising five FETs (i.e., the number of FETs m=$n_f$=5). However, it should be understood that such a complex semiconductor structure can comprise any number (even or odd) of two or more electrically connected FETs. Additionally, these FETs can have any of multiple other features (e.g., halo regions, extension regions, etc.), which are well known in the art and which are omitted from this specification in order to allow the reader to focus on the salient aspects of the invention. Furthermore, as mentioned above, instead of multiple electrically connected FETs with a multi-finger gate structure, the complex semiconductor structure could comprise multiple electrically connected BJTs with a multi-finger base structure.

Referring again to FIG. 1, the processor(s) 120 can comprise a plurality of tools including, but not limited to, a parasitic extraction tool 121 and a simulation tool 122.

Figure 5:
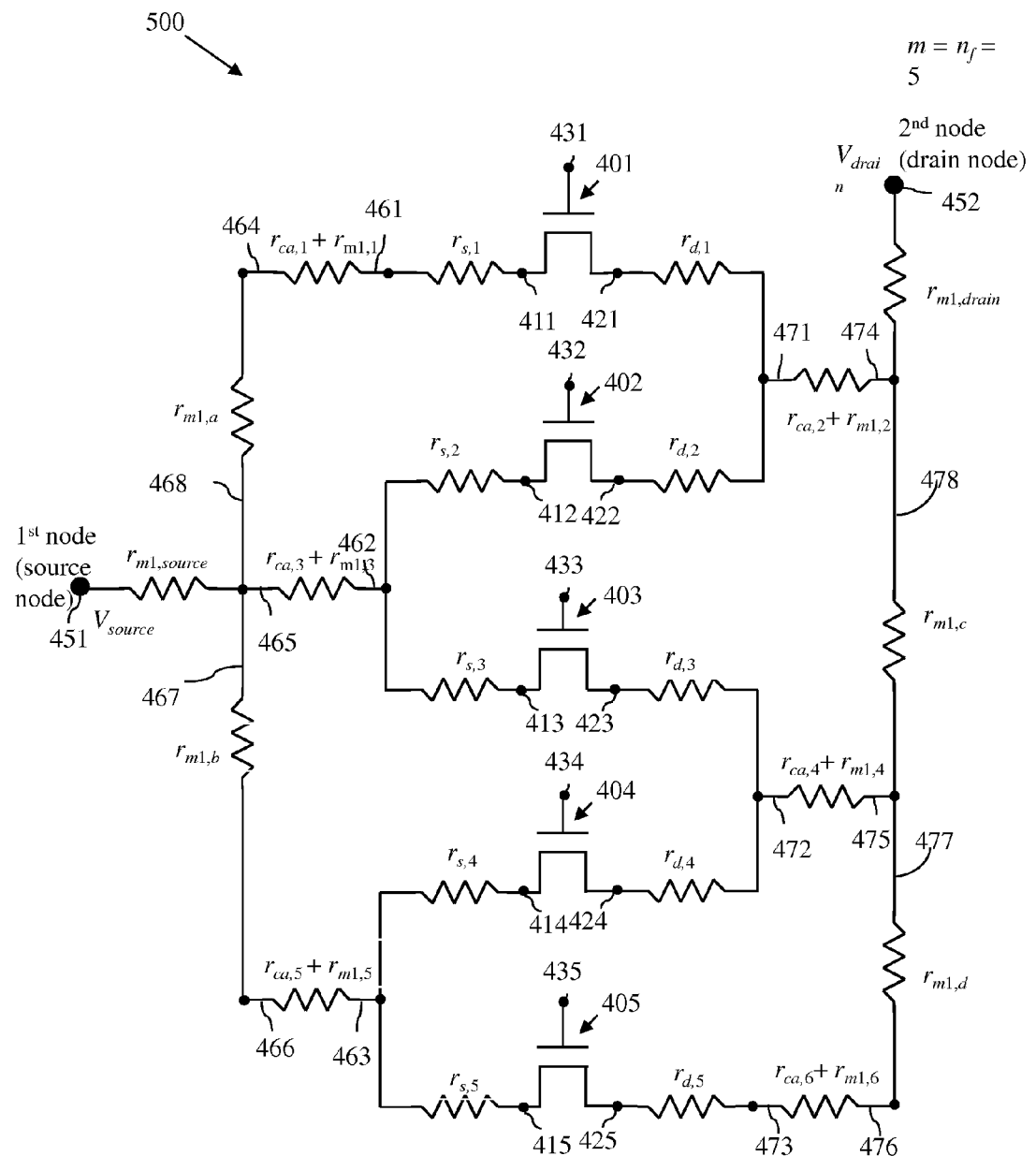
FIG. 5 is schematic drawing illustrating a portion of a full resistor network generated for the structure of FIG. 4.
Figure 6:
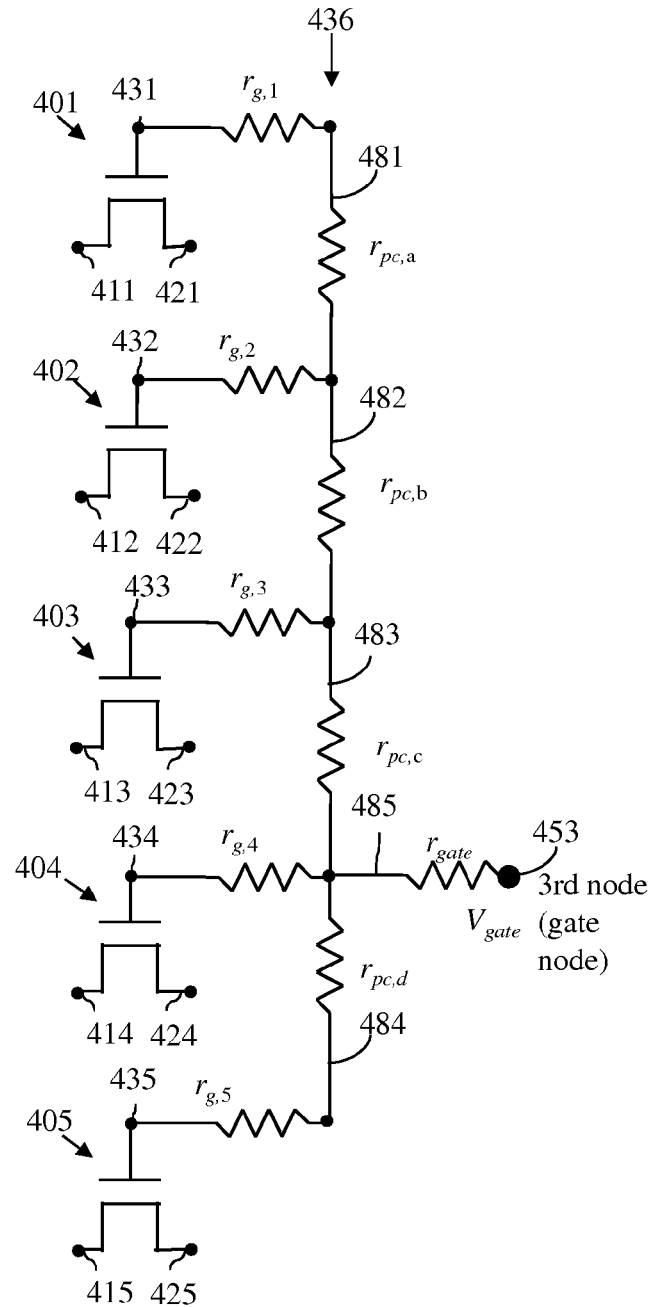
FIG. 6 is schematic drawing illustrating another portion of the full resistor network generated for the structure of FIG. 4.

The parasitic extraction tool 121 can access the design 111 from memory 110 (i.e., can be adapted to access the design 111 from memory 110, can be configured to access the design 111 from memory 110, etc.). The parasitic extraction tool 121 can, based on this design 111, generate (i.e., can be adapted to generate, can be configured to generate, etc.) a full resistor network that illustrates the resistive elements present in the interconnects 461-468, 471-478 and 481-485 within the complex semiconductor structure 400 between the first terminals 411-415 and the first node 451, between the second terminals 421-425 and the second node 452 and between the third terminals 431-435 and the third node 453, respectively. FIGS. 5 and 6 illustrate discrete portions 500, 600 of this full resistive network. Specifically, FIG. 5 shows a portion 500 of the full resistor network for the complex semiconductor structure 400 and, particularly, the various resistive elements in the complex semiconductor structure 400 from the first terminals 411-415 (i.e., the sources) through the first interconnects 461-468 (which, as mentioned above, can comprise a combination of first contacts 461-463 and first wire segments 464-468) to the first node 451 and from the second terminals 421-425 (i.e., drains) through the second interconnects 471-478 (which, as mentioned above, can comprise a combination of second contacts 471-473 and second wire segments 474-478) to the second node 452. FIG. 6 shows another portion of the full resistor network for the complex semiconductor structure 400 and, particularly, the various resistive elements in the complex semiconductor structure 400 from the third terminals 431-435 (i.e., the gates) through third interconnects 481-485 (which, as mentioned above, can comprise a combination of segments 481-484 of an additional gate body 436 and a third contact 485) to the third node 453.

The parasitic extraction tool 121 can further modify (i.e., can be adapted to modify, can be configured to modify, etc.) the full resistor network multiple discrete times to generate multiple discrete modified resistor networks including, but not limited to, a first modified resistor network, a second modified resistor network and a third modified resistor network, as discussed in greater detail below. In any case, within the first modified resistor network all of the second terminals 421-425 of the semiconductor devices 401-405 and the second node 452 (e.g., all of the drains and the drain node in the case of FETs) can be electrically shorted together. Within the second modified resistor network all of the first terminals 411-415 of the semiconductor devices 401-405 and the first node 451 (e.g., all of the sources and the source node in the case of FETs) can be electrically shorted together. Within the third modified resistor network all of the first terminals 411-415 of the semiconductor devices 401-405 and the first node 451 (e.g., all of the sources and the source node in the case of FETs) can be electrically shorted together and, additionally, all of the second terminals 421-425 of all of the semiconductor devices 401-405 and the second node 452 (e.g., all of the drains and the drain node in the case of FETs) can be also electrically shorted together.

The simulation tool 122 can perform (i.e., can be adapted to perform, can be configured to perform, etc.) multiple discrete simulations using these discrete modified resistor networks, respectively, and can use the results to determine the merged resistance values for the same-type terminals of the semiconductor devices 401-405 in the complex semiconductor structure 400. Specifically, as discussed in greater detail below, the simulation tool 122 can perform at least a first simulation using the first modified resistor network to obtain a first result, a second simulation using the second modified resistor network to obtain a second result, and a third simulation using the third modified resistor network to obtain a third result. The simulation tool 122 can further determine a first merged resistance value ($R_s$) (i.e., a merged source resistance value) associated with the first terminals 411-415 (i.e., all of the sources) based on the first result, a second merged resistance value ($R_d$) (i.e., a merged drain resistance value) associated with the second terminals 421-425 (i.e., all of the drains) based on the second result, and a third merged resistance value ($R_g$) (i.e., a merged gate resistance value) associated with the third terminals 431-435 based on the third result.

It should be noted that, depending upon the embodiment, the parasitic extraction tool 121 must modify the full resistor network of FIGS. 5-6 to generate, not only the three modified resistor networks described above, but one or more additional modified resistor networks, and the simulator tool 122 must perform, not only the three simulations described above, but one or more additional simulation processes, in order to ultimately determine these merged resistance values ($R_s$), ($R_d$) and ($R_g$).

For example, in one embodiment, before the first merged resistance value ($R_s$) and the second merged resistance value ($R_d$) can be determined, the parasitic extraction tool 121 can also modify the full resistor network to generate an additional modified resistor network, wherein the first terminals 411-415 (i.e., the sources) are electrically shorted together and shorted to the first node 451 (i.e., the source node), the second terminals 421-425 (i.e., the drains) are electrically shorted together and shorted to the second node 452 (i.e., the drain node), and the third terminals 431-435 (i.e., the gates) are electrically shorted together and shorted to the third node 453 (i.e., the gate node), and the simulation tool 122 can perform an additional simulation to obtain an additional result. This additional result can be used to determine both the first merged resistance value ($R_s$) and the second merged resistance value ($R_d$).

Figure 7:
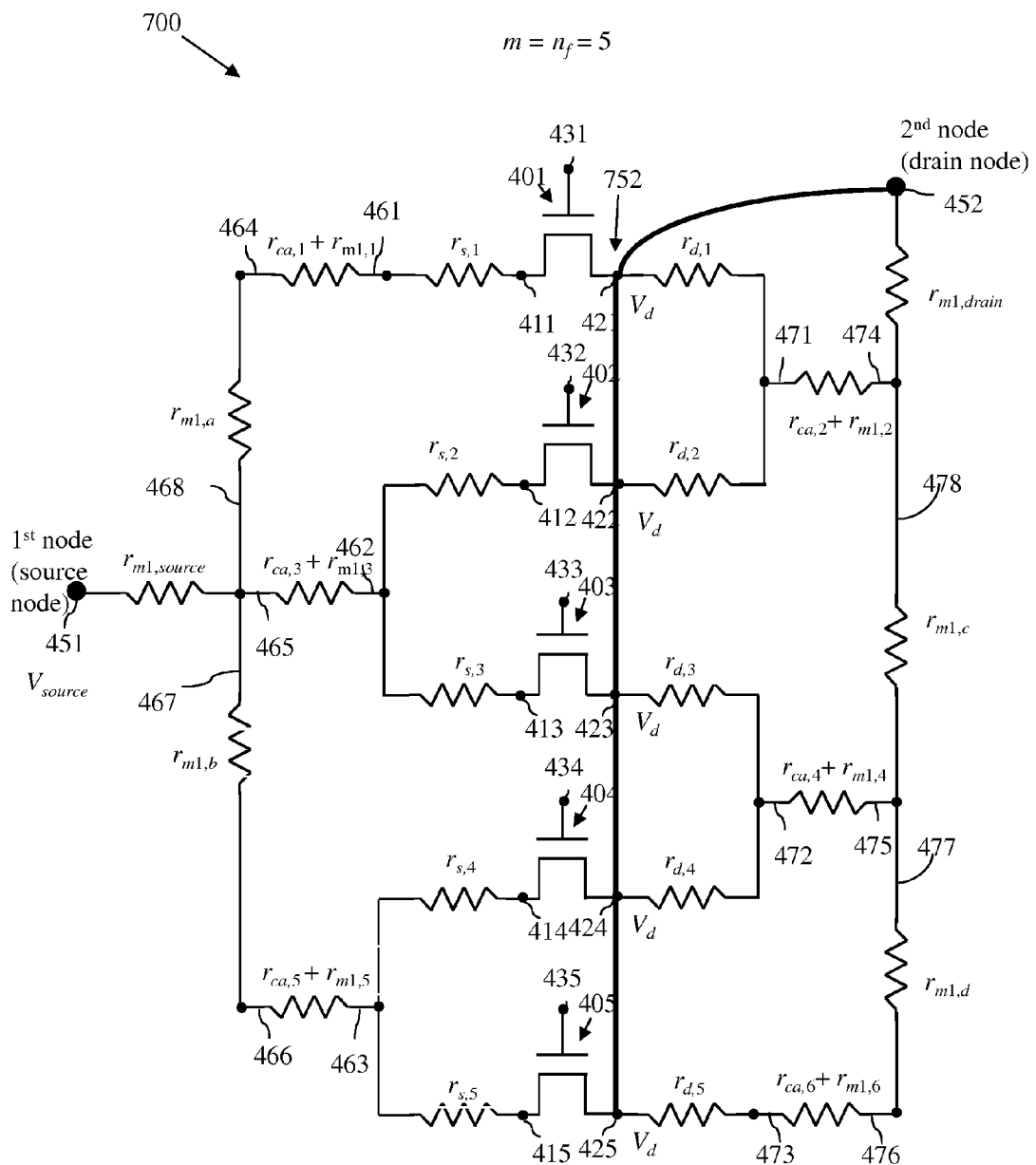
FIG. 7 is a schematic drawing illustrating an exemplary first modified resistor network.
Figure 8:
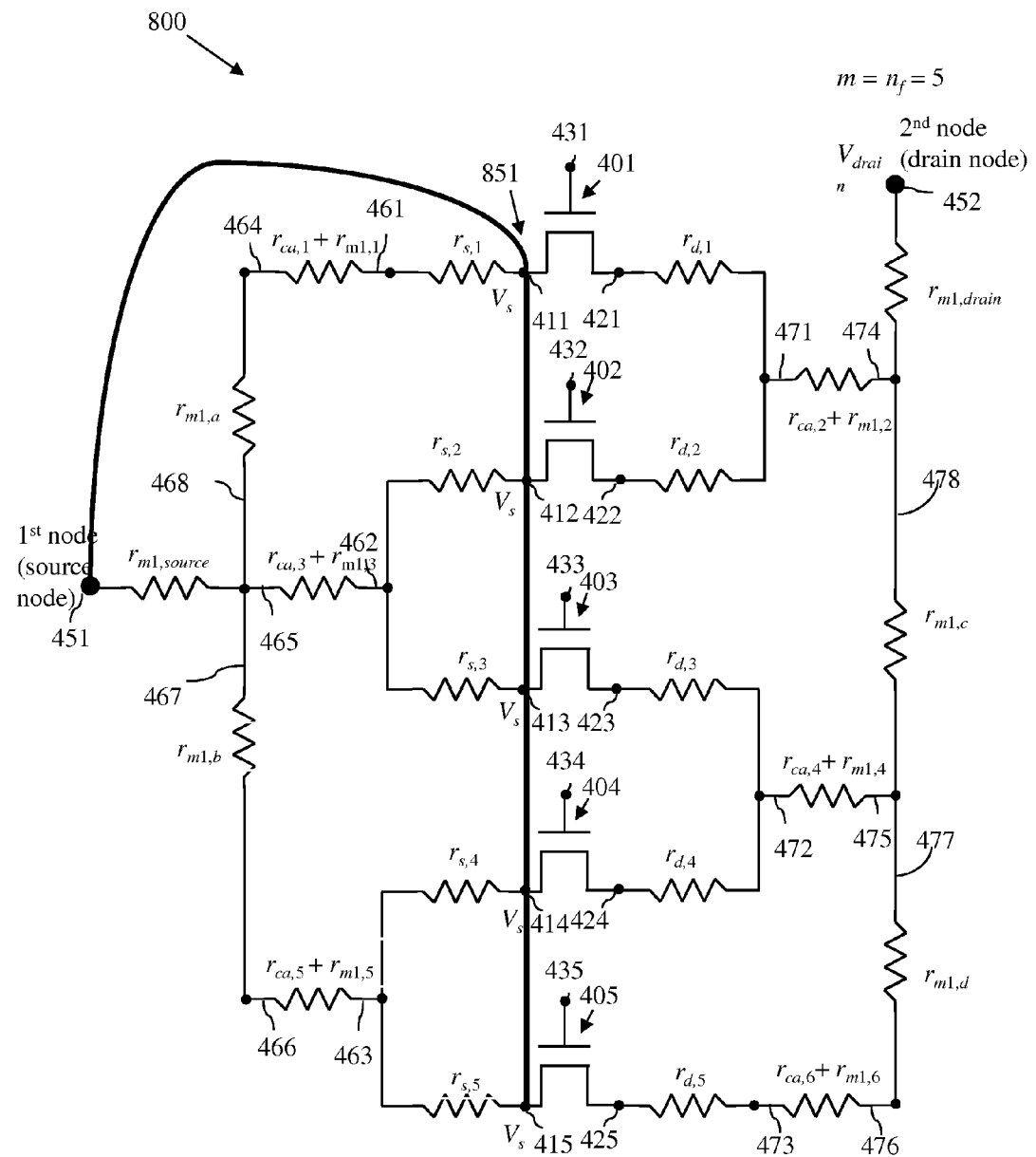
FIG. 8 is a schematic drawing illustrating an exemplary second modified resistor network.

More specifically, in this embodiment, the parasitic extraction tool 121 can modify (i.e., can be adapted to modify, be can be configured to modify, etc.) the full resistor network and, particularly, the portion 500 of the full resistor network, as shown in FIG. 5, to generate a first modified resistor network 700, as shown in FIG. 7, wherein all of the second terminals 421-425 of the semiconductor devices 401-405 and the second node 452 (e.g., all of the drains and the drain node in the case of FETs) are electrically shorted together and a second modified resistor network 800, as shown in FIG. 8, wherein all of the first terminals 411-415 of the semiconductor devices 401-405 and the first node 451 (e.g., all of the sources and the source node in the case of FETs) are electrically shorted together shorted. Shorting of the first terminals 411-415 and the first node 451 in the second modified resistor network 800 of FIG. 8 can be represented by a first zero-resistance connector 851 and, similarly, shorting of the second terminals 421-425 and the second node 452 in the first modified resistor network 700 of FIG. 7 can be represented by a second zero-resistance connector 752. Additionally, the parasitic extraction tool 121 can modify (i.e., can be adapted to modify, be can be configured to modify, etc.) the full resistor network and, particularly, the portion 500 of the full resistor network, as shown in FIG. 5, to generate an additional modified resistor network 900, as shown in FIG. 9, wherein all of the first terminals 411-415 (i.e., the sources) of the semiconductor devices 401-405 and the first node 451 (i.e., the source node) are electrically shorted together (e.g., as represented by a first zero-resistance connector 951), where all of the second terminals 421-425 (i.e., the drains) of the semiconductor devices 401-405 and the second node 452 (i.e., the drain node) are electrically shorted together (e.g., as represented by a second zero-resistance connector 952) and where all third terminals 431-435 (i.e., the gates) of the semiconductor devices 401-405 and the third node 453 (i.e., the gate node) are electrically shorted together (e.g., as represented by third zero-resistance connector 953).

Figure 9:
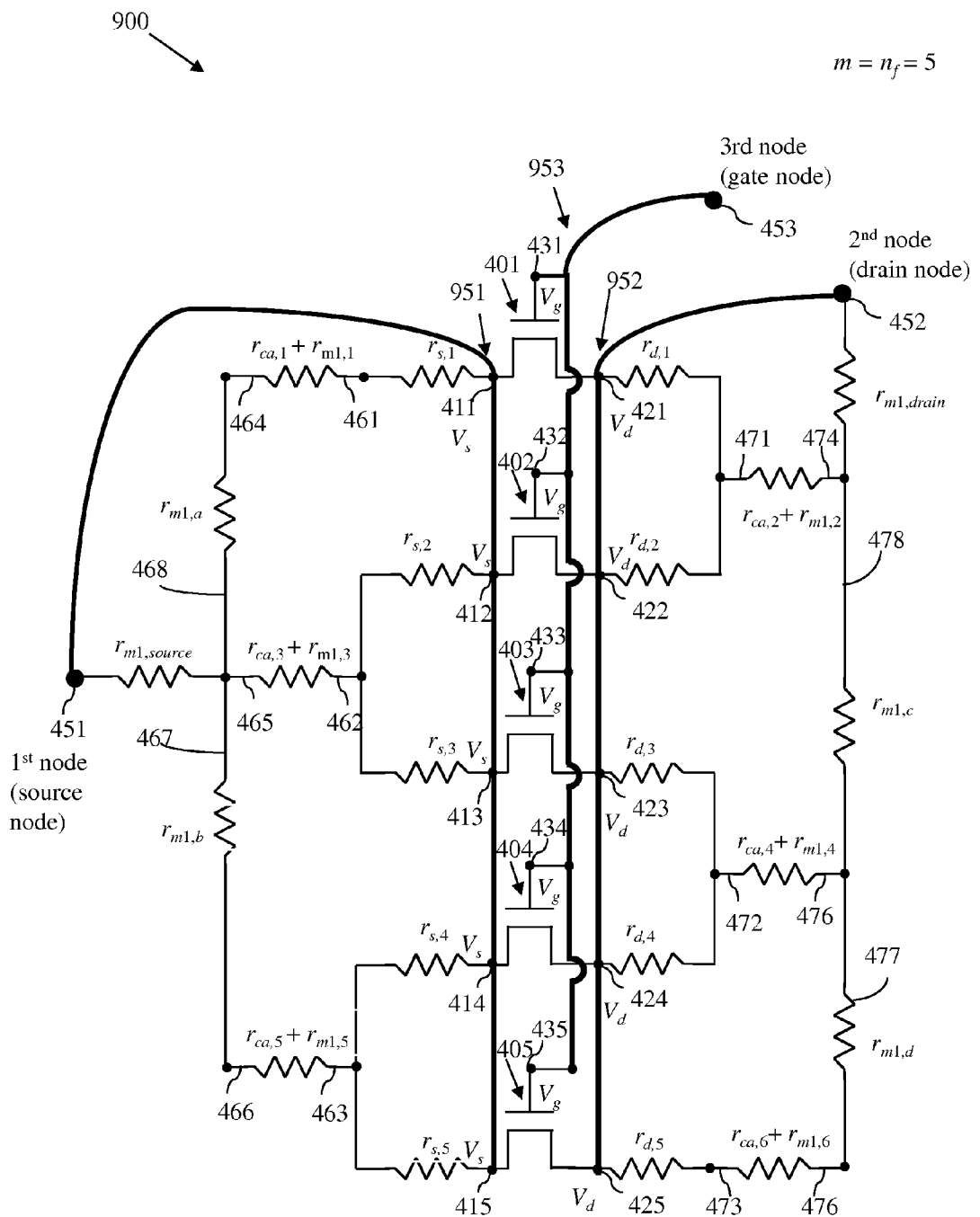
FIG. 9 is a schematic drawing illustrating an exemplary additional modified resistor network.

In this case, the simulation tool 122 can perform (i.e., can be adapted to perform, can be configured to perform, etc.) the first simulation using the first modified resistor network 700 of FIG. 7 to obtain the first result, the second simulation using the second modified resist 800 of FIG. 8 to obtain the second result, and an additional simulation using the additional modified resistor network 900 of FIG. 9 to obtain an additional result. The first simulation, second simulation and additional simulation can all comprise DC simulations and these DC simulations can be performed such that the first result of the first simulation comprises a first resistance value ($R_1$) in the absence of second terminal resistance (i.e., a source plus channel resistance value in the absence of drain resistance or, more particularly, the resistance between the second terminals 421-425 and the first node 451, as shown in FIG. 7), such that the second result of the second simulation comprises a second resistance value ($R_2$) in the absence of first terminal resistance (i.e., a drain plus channel resistance value in the absence of source resistance or, more particularly, the resistance between the first terminals 411-415 and the second node 452, as shown in FIG. 8) and such that the additional result of the additional simulation comprises an additional resistance value ($R_{ch}$) in the absence of first, second and third terminal resistances (i.e., a channel resistance value in the absence of source, drain and gate resistances).

The first resistance value ($R_1$) can be equal to a ratio of the voltage difference between the second terminals 421-425 and the first node 451 (i.e., the drain voltage ($V_d$-$V_{source}$)) to a first current value ($I_1$) (e.g., a first overdrive linear current I(od, lin)$_1$) obtained specifically when none of the resistance between the second terminals 421-425 (i.e., the internal drains) and the second (i.e., external drain) node 452 is included in the current paths. That is, the first resistance value ($R_1$) can be determined using the following equation:

$$R_1(od, lin; \text{source} + \text{channel}) \frac{V_d - V_{source}}{I(od, lin)_1}. \quad (1)$$

Similarly, the second resistance value ($R_2$) can be equal to a ratio of the voltage difference between the second node 452 and the first terminals 411-415 (i.e., the drain voltage ($V_{drain}$-$V_s$)) to a second current value ($I_2$) (e.g., a second overdrive linear current I(od, lin)$_2$) obtained specifically when none of the resistance between the first terminals 411-415 (i.e., the sources) and the first node 451 is included in the current paths. That is, the second resistance value ($R_2$) can be determined using the following equation:

$$R_2(od, lin; \text{drain} + \text{channel}) = \frac{V_{drain} - V_s}{I(od, lin)_2}. \quad (2)$$

The additional resistance value ($R_{ch}$) (i.e., the channel resistance value) can comprise, for example, a ratio of the voltage difference between the second terminals 421-425 and the first terminals 411-415 (i.e., the drain voltage ($V_d$-$V_s$)) to an additional current value ($I_a$) (e.g., an additional overdrive linear current I(od, lin)$_a$) obtained specifically when none of the resistance beyond the first terminals 411-415 (i.e., beyond the internal sources) and beyond the second terminals 421-425 (i.e., beyond the internal drains) is included in the current paths. That is, the additional resistance value ($R_{ch}$) can be determined using the following equation:

$$R_{ch}(od, lin) = \frac{V_d - V_s}{I(od, lin)_a}. \quad (3)$$

It should be understood that for purposes of this disclosure overdrive linear or (od, lin) describes parameters wherein the voltage difference between the third terminals 431-435 and the first terminals 411-415 of the semiconductor devices 401-405 (i.e., the voltage difference between the gate voltage and the source voltage ($V_g$-$V_s$)) is set at to achieve an overdrive condition, also referred to herein the device-turned-on condition, and the voltage difference between the second terminals 421-425 and the first terminals 411-415 of the semiconductor devices 401-405 (i.e., the voltage difference between the drain voltage and the source voltage ($V_d$-$V_s$)) is set in to achieve a linear condition wherein the current-voltage (I-V) behavior between the second terminals and the first terminals is linear. For example, in order to achieve the overdrive condition, voltages at the first node 451, second node 452 and third node 453 (i.e., $V_{source}$, $V_{drain}$ and $V_{gate}$, respectively) can be set such that the voltage difference between the third node 453 and the first node 451 (i.e., $V_{gate}$-$V_{source}$) is, for example, at around $V_{dd}$ or the circuit/device's power supply voltage. Additionally, in order to achieve the linear condition, the voltages at the first node 451, second node 452 and third node 453 (i.e., $V_{source}$, $V_{drain}$ and $V_{gate}$, respectively) can further be set such that the voltage difference between the second node 452 and the first node 451 (i.e., $V_{drain}$-$V_{source}$) is, for example, between 20 and 100 millivolts (e.g., 50 millivolts).

Once the first resistance value ($R_1$), the second resistance value ($R_2$) and the additional resistance value ($R_{ch}$) (i.e., the channel resistance value) are obtained, the simulation tool 122 can then determine the first merged resistance value ($R_s$) associated with all of the first terminals 411-415 of the semiconductor devices 401-405 in the complex semiconductor structure 400 (i.e., a merged source resistance value) based on the first result (i.e., the first resistance value ($R_1$)) and the additional result (i.e., the additional resistance value and, particularly, the channel resistance value ($R_{ch}$)). Specifically, the merged source resistance value ($R_s$) can be determined using the following equation:

$$R_s = R_1(od, lin; \text{source} + \text{channnl}) - R_{ch}(od, lin) \quad (4)$$

Similarly, the simulation tool 122 can determine the second merged resistance value ($R_d$) associated with all of the second terminals 421-425 of the semiconductor devices 401-405 in the complex semiconductor structure 400 (i.e., a merged drain resistance value) based on the second result (i.e., the second resistance value ($R_2$)) and the additional result (i.e., the additional resistance value and, particularly, the channel resistance value ($R_{ch}$)). Specifically, the merged drain resistance value ($R_d$) can be determined using the following equation:

$$R_d = R_2(od, lin; \text{drain} + \text{channnl}) - R_{ch}(od, lin) \quad (5)$$

Alternatively, instead of modifying the full resistor network to generate a first modified resistor network 700, as shown in FIG. 7, a second modified resistor network 800, as shown in FIG. 8, and an additional modified resistor network 900, as shown in FIG. 9 and performing the first, second and additional simulations described above in order to solve the equations (4) and (5) to determine the merged resistance values for the first terminals 411-415 and second terminals 421-425, respectively, as described above, the parasitic extraction tool 121 and simulation tool 122 can perform the following to determine the merged resistance values for the first terminals 411-415 and second resistance values 421-425.

Figure 10:
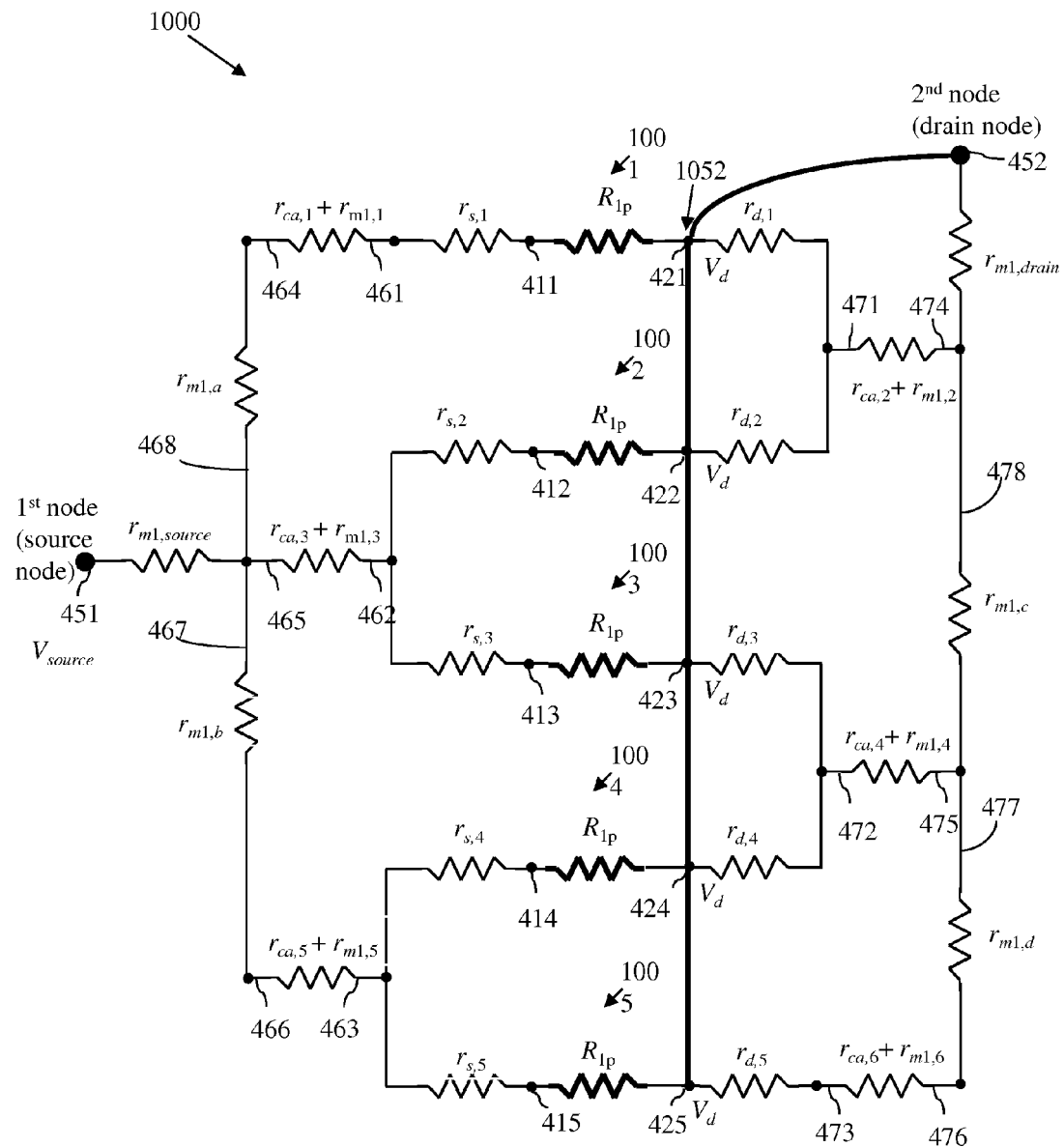
FIG. 10 is a schematic drawing illustrating an alternative first modified resistor network.

The parasitic extraction tool 121 can modify (i.e., can be adapted to modify, can be configured to modify, etc.) the full resistor network and, particularly, the portion 500 of the full resistive network as shown in FIG. 5 to generate a first modified resistor network 1000, as shown in FIG. 10, where not only are all of the second terminals 421-425 of the semiconductor devices 401-405 (i.e., all of the drains) and the second node 452 (i.e., the drain node) electrically shorted together (e.g., as represented by the second zero-resistance connector 1052), but where all of the semiconductor devices 401-405 are further replaced with first resistors 1001-1005 having a relatively large first preset resistance ($R_{1p}$). Each first resistor can connect the first and second terminals of the FET that it is replacing. For example, the first resistor 1001 can electrically connect the first terminal 411 (i.e., the source) and the second terminal 421 (i.e., the drain) of the FET 401 it is replacing, the first resistor 1002 can connect the first terminal 412 (i.e., the source) and the second terminal 422 (i.e., the drain) of the FET 402 it is replacing, and so on. The first preset resistance ($R_{1p}$) can be preset so that it is greater than an estimated maximum value (i.e., an estimated upper bound) for the first merged resistance value ($R_s$) (i.e., the merged source resistance value) multiplied by the total number of the semiconductor devices (m) in the complex semiconductor structure 400 and further multiplied by some additional number (e.g., 100, 1000, etc.). For example, the first preset resistance value ($R_{1p}$) can be preset so that it satisfies the following expression:

$$R_{1p} > 100\, m R_{s,max}, \qquad (6)$$

where $R_{s,max}$ is the estimated maximum value for the first merged resistance value.

Figure 11:
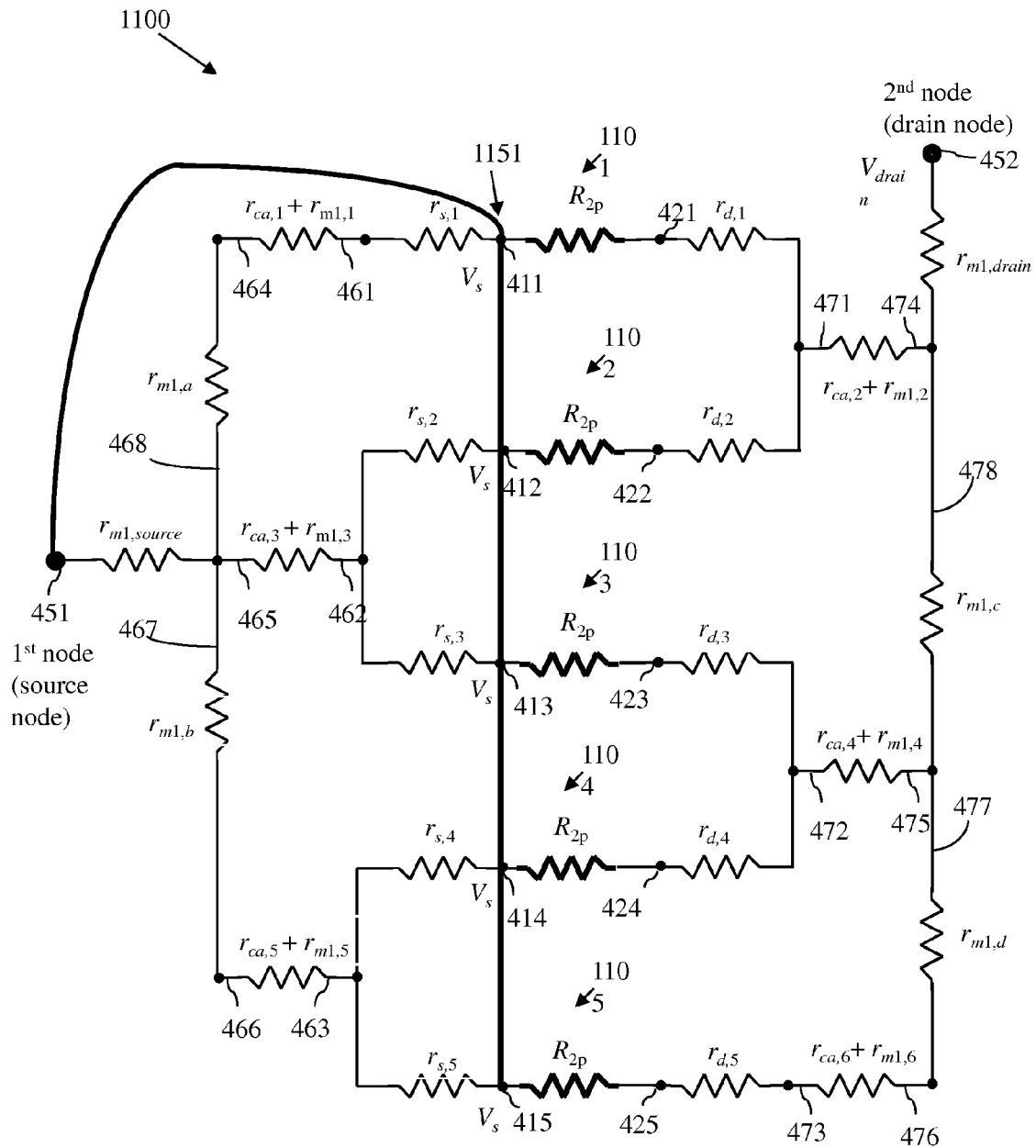
FIG. 11 is a schematic drawing illustrating an alternative second modified resistor network.

Similarly, the parasitic extraction tool 121 can modify (i.e., can be adapted to modify, can be configured to modify, etc.) the full resistor network and, particularly, the portion 500 of the full resistive network as shown in FIG. 5 to generate a second modified resistor network 1100, as shown in FIG. 11, where not only are all of the first terminals 411-415 of the semiconductor devices 401-405 (i.e., all of the sources) and the first node 451 (i.e., the source node) electrically shorted (e.g., as represented by the first zero-resistance connector 1151), but all of the semiconductor devices 401-405 are further replaced with second resistors 1101-1105 having a relatively large second preset resistance ($R_{2p}$). Each second resistor can connect the first and second terminals of the FET that it is replacing. For example, the second resistor 1101 can electrically connect the first terminal 411 (i.e., the source) and the second terminal 421 (i.e., the drain) of the FET 401 it is replacing, the second resistor 1102 can connect the first terminal 412 (i.e., the source) and the second terminal 422 (i.e., the drain) of the FET 402 it is replacing, and so on. The second preset resistance ($R_{2p}$) can be preset so that it is greater than an estimated maximum value (i.e., an estimated upper bound) for the second merged resistance value ($R_d$) (i.e., the merged drain resistance value) multiplied by the total number of the semiconductor devices (m) in the complex semiconductor structure 400 and further multiplied by some additional number (e.g., 100, 1000, etc.). For example, the second preset resistance value ($R_{2p}$) can be preset so that it satisfies the following expression:

$$R_{2p} > 100\, m R_{d,max}, \qquad (7)$$

where $R_{d,max}$ is the estimated maximum value for the second merged resistance value.

It should be noted that the first terminals 411-415 in the second modified resistor network 1100 of FIG. 11 can be shorted together and shorted to the first node 451 in a copy of the original netlist. In this netlist, this can be accomplished either by replacing each of the first terminals 411-415 by the first node 451 or by applying a same voltage $V_s=V_{source}$ to each of the first terminals 411-415. In FIG. 11, this is illustrated by using a first zero-resistance connector 1151 to short all of the first terminals 411-415 (i.e., the sources) and the first node 451 (i.e., the source node) together. Similarly, the second terminals 421-425 in the first modified resistor network 1000 of FIG. 10 can be shorted together and to the second node 452 in another copy of the original netlist. In this netlist, this can be accomplished either by replacing each of the second terminals 421-425 by the second node 452 or by applying a same voltage $V_d=V_{drain}$ to each of the second terminals 421-425. In FIG. 10, this is illustrated by using a second zero-resistance connector 1052 to short all of the second terminals 421-425 (i.e., the drains) and the second node 452 (i.e., the drain node) together.

In this case, the simulation tool 122 can subsequently perform (i.e., can be adapted to perform, can be configured to perform, etc.) a first simulation and, particularly, a first DC simulation using the first modified resistor network 1000 of FIG. 10 to obtain a first current value ($J_1$) specifically when none of the resistance beyond the second terminals 421-425 (i.e., beyond the internal drains) is included in the current paths. The simulation tool 122 can then use (i.e., can be adapted to use, can be configured to use, etc.) this first current value ($J_1$) as well as a voltage difference between the voltage $V_d$ on the second terminals 421-425 and the voltage $V_{source}$ at the source node 451, the first preset resistance ($R_{1p}$) and the total number of semiconductor devices (m) to determine the first merged resistance value ($R_s$) associated with all of the first terminals 411-415 of the semiconductor devices 401-405 in the complex semiconductor structure 400 (i.e., the merged source resistance value). Specifically, this first merged resistance value ($R_s$) (i.e., the merged source resistance value) can be determined using the following equation:

$$R_s = \frac{V_d - V_{source}}{J_1} - \frac{R_{1p}}{m}. \qquad (8)$$

The simulation tool 122 can also perform (i.e., can be adapted to perform, can be configured to perform, etc.) a second simulation and, particularly, a second DC simulation using the second modified resistor network 1100 of FIG. 11 to obtain a second current value ($J_2$) specifically when none of resistance beyond the first terminals 411-415 (i.e., beyond the internal sources) is included in the current paths. The simulation tool 122 can then use (i.e., can be adapted to use, can be configured to use, etc.) this second current value ($J_2$) as well as a voltage difference between the voltage $V_{drain}$ on the drain node 452 and the voltage $V_s$ at the first terminals 411-415, the second preset resistance ($R_{2p}$) and the total number of semiconductor devices (m) to determine a second merged resistance value ($R_d$) associated with all of the second terminals 421-425 of the semiconductor devices 401-405 in the complex semiconductor structure 400 (i.e., a merged drain resistance value). Specifically, this second merged resistance value ($R_d$) (i.e., the merged drain resistance value) can be determined using the following equation:

$$R_d = \frac{V_{drain} - V_s}{J_2} - \frac{R_{2p}}{m}. \qquad (9)$$

Regardless of which of the above described techniques are used to determine the first merged resistance value ($R_s$) and the second merged resistance value ($R_d$), a third merged resistance value ($R_g$) associated with all of the third terminals 431-435 of the semiconductor devices 401-405 (i.e., all of the gates) must also be determined. To accomplish this, in one embodiment, before the third merged resistance value ($R_g$) can be determined, the parasitic extraction tool 121 can also modify the full resistor network to generate an additional modified resistor network, wherein the first terminals 411-415 (i.e., the sources) and the first node 451 (i.e., the source node) are electrically shorted together, the second terminals 421-425 (i.e., the drains) and the second node 452 (i.e., the drain node) are electrically shorted together and the third terminals 431-435 (i.e., the gates) and the third node 453 (i.e., the gate node) are electrically shorted together, and the simulation tool 122 can perform an additional simulation to obtain an additional result. This additional result along with the third result of the third simulation can be used to determine the third merged resistance value ($R_g$).

Figure 12:
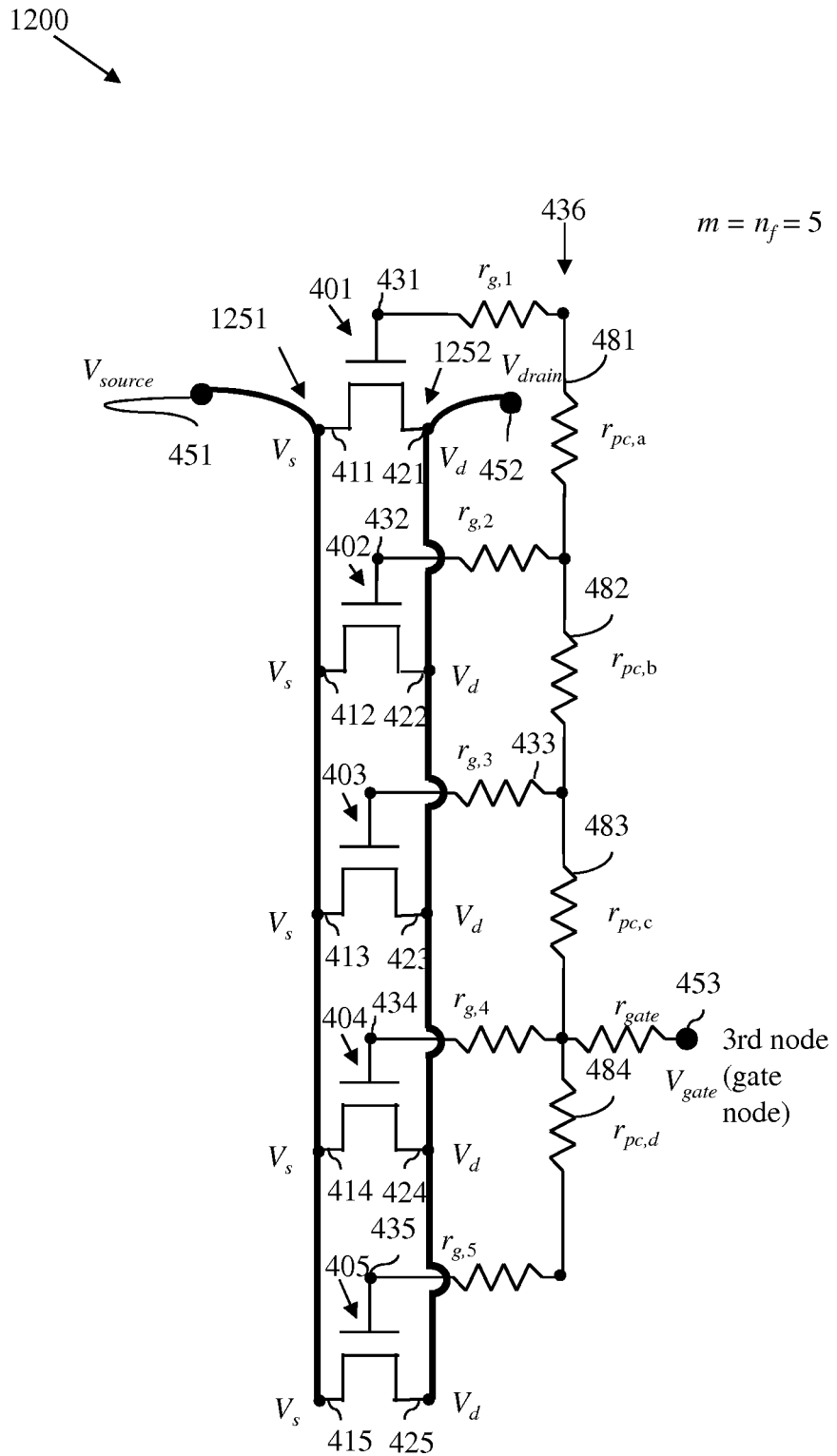
FIG. 12 is a schematic drawing illustrating an exemplary third modified resistor network.

More specifically, in this embodiment, the parasitic extraction tool 121 can modify (i.e., can be adapted to modify, can be configured to modify, etc.) the full resistor network and, particularly, the portion 600 of the full resistor network as shown in FIG. 6 to generate a third modified resistor network 1200, as shown in FIG. 12, where all of the first terminals 411-415 (i.e., all of the sources) of the semiconductor devices 401-405 and the first node 451 (i.e., the source node) are electrically shorted together and all of the second terminals 421-425 (i.e., all of the drains) of all of the semiconductor devices 401-405 and the second node 452 (i.e., the drain node) are also electrically shorted together in yet another copy of the original netlist. In the netlist, this can be accomplished either (i) by replacing each of the first terminals 411-415 by the first node 451 and also replacing each of the second terminals 421-425 by the second node 452 or (ii) by applying a same voltage $V_s = V_{source}$ to each of the first terminals 411-415 and also applying a same voltage $V_s = V_{source}$ to the second terminals 421-425. In FIG. 12, this is illustrated by using a first zero-resistance connector 1251 to short all of the first terminals 411-415 and the first node 451 (i.e., the source node) together and using a second zero-resistance connector 1252 to short all of the second terminals 421-425 and the second node 452 (i.e., the drain node) together. Additionally, the parasitic extraction tool 121 can modify (i.e., can be adapted to modify, be can be configured to modify, etc.) the full resistor network and, particularly, the portion 500 of the full resistor network, as shown in FIG. 5, to generate an additional modified resistor network 900, as shown in FIG. 9, wherein all of the first terminals 411-415 (i.e., the sources) are electrically shorted together and to the first node 451 by a first zero-resistance connector 951, all of the second terminals 421-425 are electrically shorted together and to the second node 452 by a second zero-resistance connector 952, and all third terminals 431-435 (i.e., the gates) are electrically shorted together and to the third node 453 by a third zero-resistance connector 953.

Additionally, prior to performing the third simulation, the simulation tool 122 can perform (i.e., can be adapted to perform, can be configured to perform, etc.) an additional simulation using the additional modified resistor network 900, as shown in FIG. 9, to obtain an additional result. In this case, the additional simulation can comprise an AC simulation and the additional result can comprise a first admittance value ($Y_1$) between (i) the third node and (ii) further shorted first and second nodes. The simulation tool 122 can then determine (i.e., can be adapted to determine, can be configured to determine, etc.) a first impedance value ($Z_1$), based on the first admittance value ($Y_1$), and a first effective resistance value ($R_{eff1}$), based on the first impedance value ($Z_1$). Specifically, those skilled in the art will recognize that an admittance value is a measure of how easily current will flow and is the inverse of impedance. That is, admittance (Y) can be expressed as follows:

$$Y = 1/Z. \quad (10)$$

Furthermore, those skilled in the art will recognize that impedance (Z) comprises both a real part (i.e., a resistance part) and an imaginary part (i.e., a reactance part). In this case, the first effective resistance value ($R_{eff1}$) can be identified as the real part (i.e., the resistance part) of the first impedance value ($Z_1$) [i.e., $R_{eff1} = Re(Z_1)$] and can equate to the intrinsic device resistance. The simulation tool 122 can also perform the third simulation using the third modified resistor network 1200, as shown in FIG. 12, to obtain the third result. Like the additional simulation described above, this third simulation can comprise an AC simulation and the third result can comprise another admittance value (i.e., a second admittance value ($Y_2$) between (i) the third node and (ii) further shorted first and second nodes). The simulation tool 122 can then determine (i.e., can be adapted to determine, can be configured to determine, etc.) a second impedance value ($Z_2$), based on the second admittance value ($Y_2$) and using the equation (10) above, and a second effective resistance value ($R_{eff2}$) based on the second impedance value ($Z_2$). In this case, the second effect resistance value ($R_{eff2}$) can be identified as the real part (i.e., the resistance part) of the second impedance value ($Z_2$) [i.e., $R_{eff2} = Re(Z_2)$] and can equate to the sum of the intrinsic device resistance plus the third merged resistance value ($R_g$) associated with the third terminals 431-435. Finally, the simulation tool 122 can calculate the third merged resistance value ($R_g$) associated with the third terminals 431-435 (i.e., the gates) using the previously determined first and second effective resistance values ($R_{eff1}$) and ($R_{eff2}$) and the following expression:

$$R_g = R_{eff2} - R_{eff1}. \quad (11)$$

Figure 13:
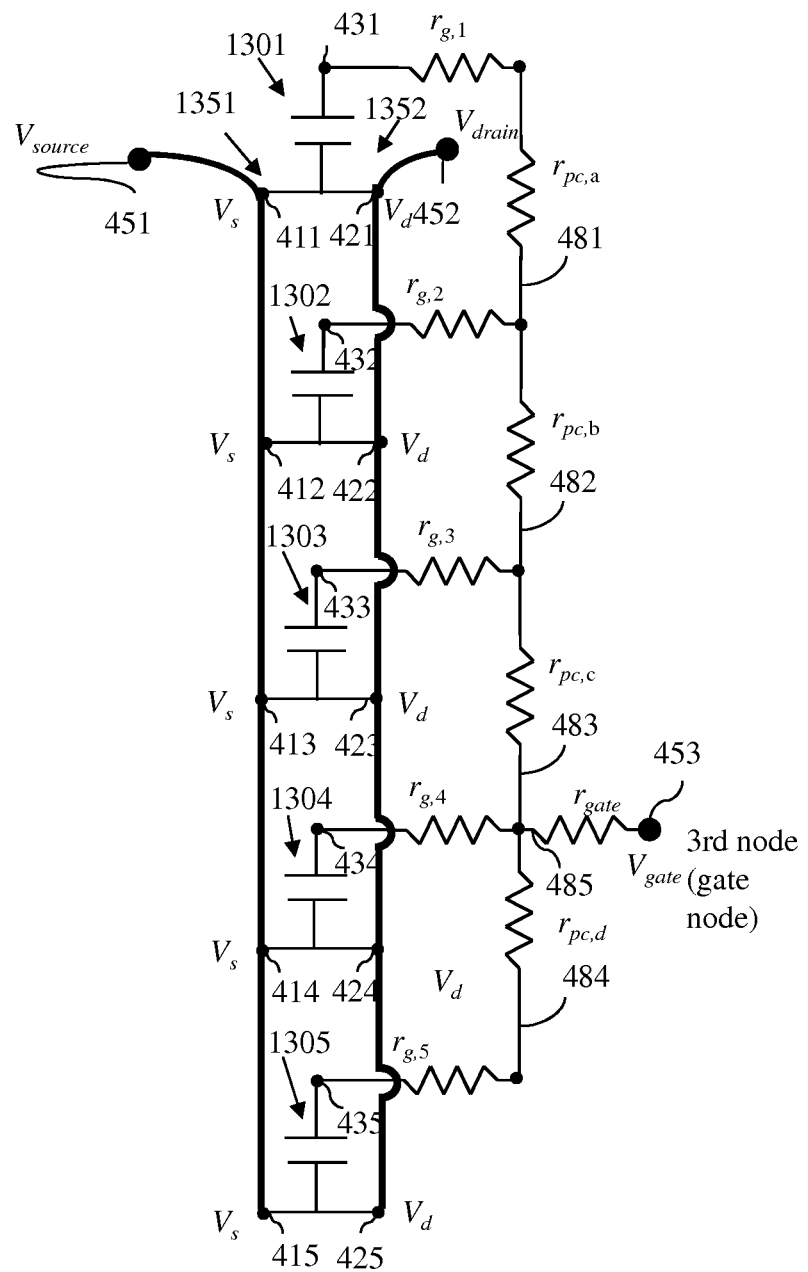
FIG. 13 is a schematic drawing illustrating an alternative third modified resistor network.

Alternatively, in another embodiment, instead of modifying the full resistor network to generate a third modified resistor network and an additional modified resistor network, performing discrete AC simulations using the third modified resistor network and the additional modified resistor network, respectively, and using the results of both of these simulations to determine the third merged resistance value ($R_g$), the parasitic extraction tool 121 can modify (i.e., can be adapted to modify, can be configured to modify, etc.) the full resistor network such that, within the third modified resistor network, the semiconductor devices are replaced by capacitors. Specifically, the parasitic extraction tool 121 can modify (i.e., can be adapted to modify, can be configured to modify, etc.) the full resistor network and, particularly, the portion 600 of the full resistor network as shown in FIG. 6 to generate a third modified resistor network 1300, as shown in FIG. 13, where all of the first terminals 411-415 of the semiconductor devices 401-405 (i.e., all of the sources) are electrically shorted together and to the first node 451 and where all of the second terminals 421-425 of all of the semiconductor devices 401-405 (i.e., all of the drains) are also electrically shorted together and to the second node 452 and where all of the semiconductor devices 401-405 are replaced by (i.e., represented by) capacitors 1201-1205. Each capacitor can have one conductive plate electrically connected to a third terminal of the FET that it is replacing and another conductive plate electrically connected to the first and second terminals of the FET that it is replacing. For example, the capacitor 1301 can have a conductive plate connected to the third terminal 431 of the FET 401 that it is replacing and another conductive plate connected to the first and second terminals 411 and 421 of the FET 401 that it is replacing, the capacitor 1302 can have a conductive plate connected to the third terminal 432 of the FET 402 that it is replacing and another conductive plate connected to the first and second terminals 412 and 422 of the FET 402 that it is replacing, and so on. In this case, the capacitors 1201-1205 can have a preset capacitance equal to capacitance at the third terminals 431-435 of the semiconductor devices 401-405 (i.e., the gate capacitance) at a given, relatively, high bias (e.g., at a gate voltage ($V_g-V_s$) equal to the positive supply voltage ($V_{dd}$)).

Once the third modified resistor network 1300, as shown in FIG. 13, is generated, the simulation tool 122 can perform (i.e., can be adapted to perform, can be configured to perform, etc.) the third simulation using the third modified resistor network 1300 to obtain a third result. This third simulation can comprise an AC simulation and the third result can comprise an admittance value (Y). Based on this admittance value (Y), the parasitic extraction tool 121 can determine (i.e., can be adapted to determine, can be configured to determine, etc.) the impedance value (Z) using the equation (10) discussed above. The simulation tool 122 can further determine (i.e., can be adapted to determine, can be configured to determine, etc.), the third merged resistance value ($R_g$) (i.e., a merged gate resistance value) associated with all of the third terminals 431-435 (i.e., all the gates) of the semiconductor devices 401-405 in the complex semiconductor structure 400 based on the impedance value (Z). In this case, the third merged resistance value ($R_g$) can be identified as the real part (i.e., the resistance part) of the impedance value (Z).

Once determined, these merged resistance values ($R_s$), ($R_d$) and ($R_g$) can subsequently be set as the resistance values for parasitic resistors connected to the terminals of a simple semiconductor device in a merged netlist (e.g., such as that illustrated in FIG. 2 and described above) associated with the complex semiconductor structure and this merged netlist can be used to generate a provisional performance model for an integrated circuit that incorporates the complex semiconductor structure to enable faster integrated circuit simulations and model development without any loss of accuracy.

It should be noted that in the embodiments described above, the simulation tool 122 can perform the multiple simulations at a first temperature (e.g., $T_1$=25° C.) and can perform the required calculations to determine the merged resistance values as discussed. However, in order to provide a more accurate merged netlist, optionally, the simulation tool 122 can further repeat (i.e., can be adapted to repeat, can be configured to repeat, etc.) the multiple simulations at one or more additional temperatures (e.g., a second temperature ($T_2$), where $T_2$=85° C., etc.) and can repeat the required calculations to determine the merged resistance values at each of the additional temperatures. After obtaining the merged resistance values at each of the additional temperatures, the simulation tool 122 can determine (i.e., can be adapted to determine, can be configured to determine, etc.) optimal merged resistance values for all temperatures given the results of the multiple simulations performed at the first temperature and at the one or more additional temperatures. For example, the simulation tool 122 can determine the optimal merged resistance values by interpolation and extrapolation using the equation below:

$$R(T) = R(T_1) + \frac{R(T_2) - R(T_1)}{T_2 - T_1}(T - T_1). \quad (12)$$

Also disclosed herein is a method for determining merged resistance values (i.e., total combined resistance values) of same-type terminals of multiple electrically connected multi-terminal semiconductor devices in a complex semiconductor structure. These merged resistance values can subsequently be set as the resistance values for parasitic resistors connected to a simple semiconductor device in a merged netlist representative of the complex semiconductor structure and this merged netlist can be used to generate a provisional performance model for an integrated circuit that incorporates the complex semiconductor structure.

Specifically, referring to the flow diagram of FIG. 13, the method can comprise storing (e.g., in a memory 110 as shown in the system 100 of FIG. 1) a design 111 for a complex semiconductor structure (1402). As discussed in detail above with regard to the system 100 of FIG. 1, for purposes of this disclosure, a complex semiconductor structure refers to a semiconductor structure comprising multiple electrically connected semiconductor devices (e.g., multiple electrically connected field effect transistors (FETs) with a multi-finger gate structure or multiple electrically connected bipolar junction transistors (BJTs) with a multi-finger base structure). In any case, the semiconductor devices can each comprise multiple terminals. For example, in the case of a complex semiconductor structure comprising multiple electrically connected FETs, each FET can comprise a first terminal (e.g., the source), a second terminal (e.g., the drain) and a third terminal (e.g., the gate). In the case of a complex semiconductor structure comprising multiple electrically connected BJTs, each BJT can comprise a first terminal (e.g., the emitter), a second terminal (e.g., the collector) and a third terminal (e.g., the base). Additionally, all same-type terminals can be electrically connected by interconnects to a same node. That is, all of the first terminals of the semiconductor devices (e.g., all sources of the FETs or all emitters of the BJTs) can be electrically connected by one or more first interconnects to a first node, all of the second terminals of the semiconductor devices (e.g., all drains of the FETs or all collectors of the BJTs) can be electrically connected by one or more second interconnects to a second node, and all of the third terminals of the semiconductor devices (e.g., all gates of the FETs or all bases of the BJTs) can be electrically connected to by one or more third interconnects to a third node. Such a complex semiconductor structure can be represented during integrated circuit modeling by a merged netlist (e.g., see merged netlist 200 of FIG. 2 or merged netlist 300 of FIG. 3 described in detail above), which comprises a simple semiconductor device and parasitic resistors connected to the terminals of that simple semiconductor device.

The method disclosed herein can determine the resistance values at which the parasitic resistors 212a-c, 312a-c in such merged netlists 200, 300 should be set. That is, the method disclosed herein can comprise accessing the design 111 for the complex semiconductor structure from the memory 110 (1404) and determining the merged resistance values (i.e., total combined resistance values) for same-type terminals (i.e., for all first terminals, all second terminals and all third terminals) of the semiconductor devices in that complex semiconductor structure (1412).

Figure 14:
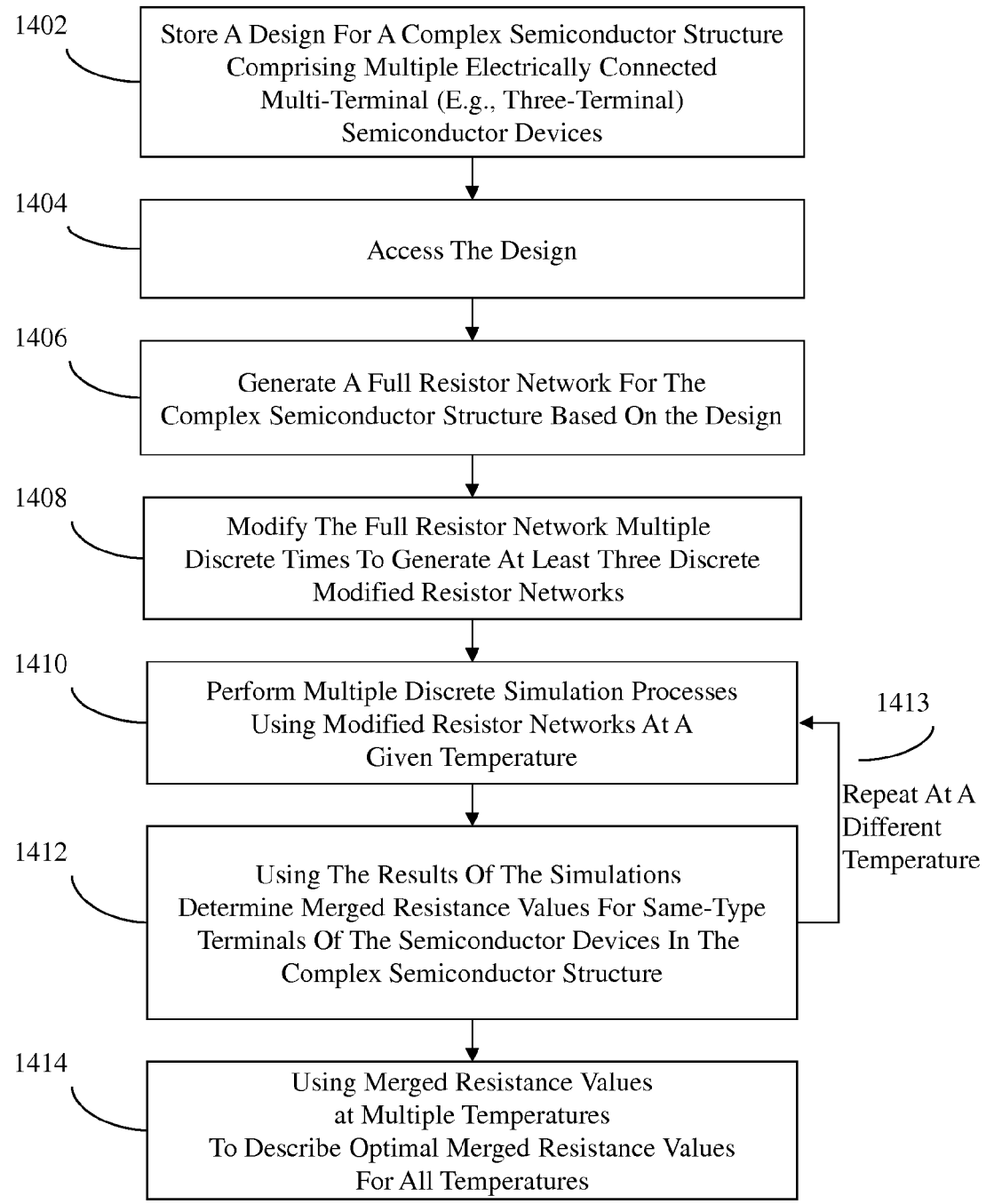
FIG. 14 is flow diagram illustrating a method for determining merged resistance values of same-type terminals of multiple electrically connected multi-terminal semiconductor devices in a complex semiconductor structure.

More specifically, referring to FIG. 14 in combination with FIG. 1, the method can comprise accessing (e.g., by a processor 120 and, particularly, by a parasitic extraction tool 121 thereof) a design 111 for a complex semiconductor structure from a memory 110. For purposes of illustration, the specific method steps are discussed below with respect to the exemplary complex semiconductor structure 400 of FIG. 4, described in detail above. However, it should be understood that the complex semiconductor structure 400 of FIG. 4 is just one example of a complex semiconductor structure for which the method disclosed herein can be used and is not intended to be limiting.

Next, the method can comprise generating (e.g., by the processor 120 and, particularly, by the parasitic extraction tool 121 thereof), based on the design 111, a full resistor network that illustrates the resistive elements present in the interconnects 461-468, 471-478 and 481-485 within the complex semiconductor structure 400 between the first terminals 411-415 and the first node 451, between the second terminals 421-425 and the second node 452 and between the third terminals 431-435 and the third node 453, respectively (1406). FIGS. 5 and 6 illustrate discrete portions 500, 600 of this full resistive network. Specifically, FIG. 5 shows a portion 500 of the full resistor network for the complex semiconductor structure 400 and, particularly, the various resistive elements in the complex semiconductor structure 400 from the first terminals 411-415 (i.e., the sources) through the first interconnects 461-468 (which, as mentioned above, can comprise a combination of first contacts 461-463 and first wire segments 464-468) to the first node 451 and from the second terminals 421-425 (i.e., drains) through the second interconnects 471-478 (which, as mentioned above, can comprise a combination of second contacts 471-473 and second wire segments 474-478) to the second node 452. FIG. 6 shows another portion of the full resistor network for the complex semiconductor structure 400 and, particularly, the various resistive elements in the complex semiconductor structure 400 from the third terminals 431-435 (i.e., the gates) through third interconnects 481-485 (which, as mentioned above, can comprise a combination of segments 481-484 of an additional gate body 436 and a third contact 485) to the third node 453.

After the full resistor network is generated at process 1406, the method can comprise modifying (e.g., by the processor 120 and, particularly, by the parasitic extraction tool 121 thereof) this full resistor network multiple discrete times to generate at least three discrete modified resistor networks including, but not limited to, a first modified resistor network, a second modified resistor network and a third modified resistor network, as discussed in greater detail below (1408). In any case, within the first modified resistor network all of the second terminals 421-425 of the semiconductor devices 401-405 and the second node 452 (e.g., all of the drains and drain node in the case of FETs) can be electrically shorted together. Within the second modified resistor network all of the first terminals 411-415 of the semiconductor devices 401-405 and first node 451 (e.g., all of the sources and source node in the case of FETs) can be electrically shorted together. Within the third modified resistor network all of the first terminals 411-415 of the semiconductor devices 401-405 and the first node 451 (e.g., all of the sources and the source node in the case of FETs) can be electrically shorted together and, additionally, all of the second terminals 421-425 of all of the semiconductor devices 401-405 and the second node 452 (e.g., all of the drains and the drain node in the case of FETs) can be also electrically shorted together.

Multiple discrete simulations can also be performed (e.g., by the processor 120 and, particularly, by a simulation tool 122 thereof) using these modified resistor networks, respectively (1410) and the results of the simulations can be used (e.g., by the processor 120 and, particularly, by the simulation tool 122 thereof) to determine the merged resistance values for the same-type terminals (i.e., for the first terminals 411-415, second terminals 421-425 and third terminals 431-435, respectively) of the multiple electrically connected multi-terminal semiconductor devices 401-405 of the complex semiconductor structure 400 (1412). Specifically, as discussed in greater detail below, at process 1410 at least a first simulation can be performed using the first modified resistor network to obtain a first result, a second simulation can be performed using the second modified resistor network to obtain a second result, and a third simulation can be performed using the third modified resistor network to obtain a third result. Then at process 1412 a first merged resistance value ($R_s$) (i.e., a merged source resistance value) associated with the first terminals 411-415 (i.e., all of the sources) can be determined based on the first result, a second merged resistance value ($R_d$) (i.e., a merged drain resistance value) associated with the second terminals 421-425 (i.e., all of the drains) can be determined based on the second result, and a third merged resistance value ($R_g$) (i.e., a merged gate resistance value) associated with the third terminals 431-435 can be determined based on the third result.

It should be noted that, depending upon the embodiment, more than three modified resistor networks can be generated at process 1408 and more than three simulations can be performed at process 1410 in order to obtain results upon which the merged resistance values ($R_s$), ($R_d$) and ($R_g$) are determined at process 1412.

For example, in one embodiment, before the first merged resistance value ($R_s$) and the second merged resistance value ($R_d$) can be determined at process 1412, the full resistor network must also be modified at process 1408 to generate an additional modified resistor network, wherein the first terminals 411-415 (i.e., the sources) and the first node 451 (i.e., the source node) are electrically shorted together, the second terminals 421-425 (i.e., the drains) and the second node 452 (i.e., drain node) are electrically shorted together and the third terminals 431-435 (i.e., the gates) and third node 453 (i.e., gate node) are electrically shorted together, and an additional simulation must be performed at process 1410 to obtain an additional result. This additional result can then be used at process 1412 to determine both the first merged resistance value ($R_s$) and the second merged resistance value ($R_d$).

Figure 15:
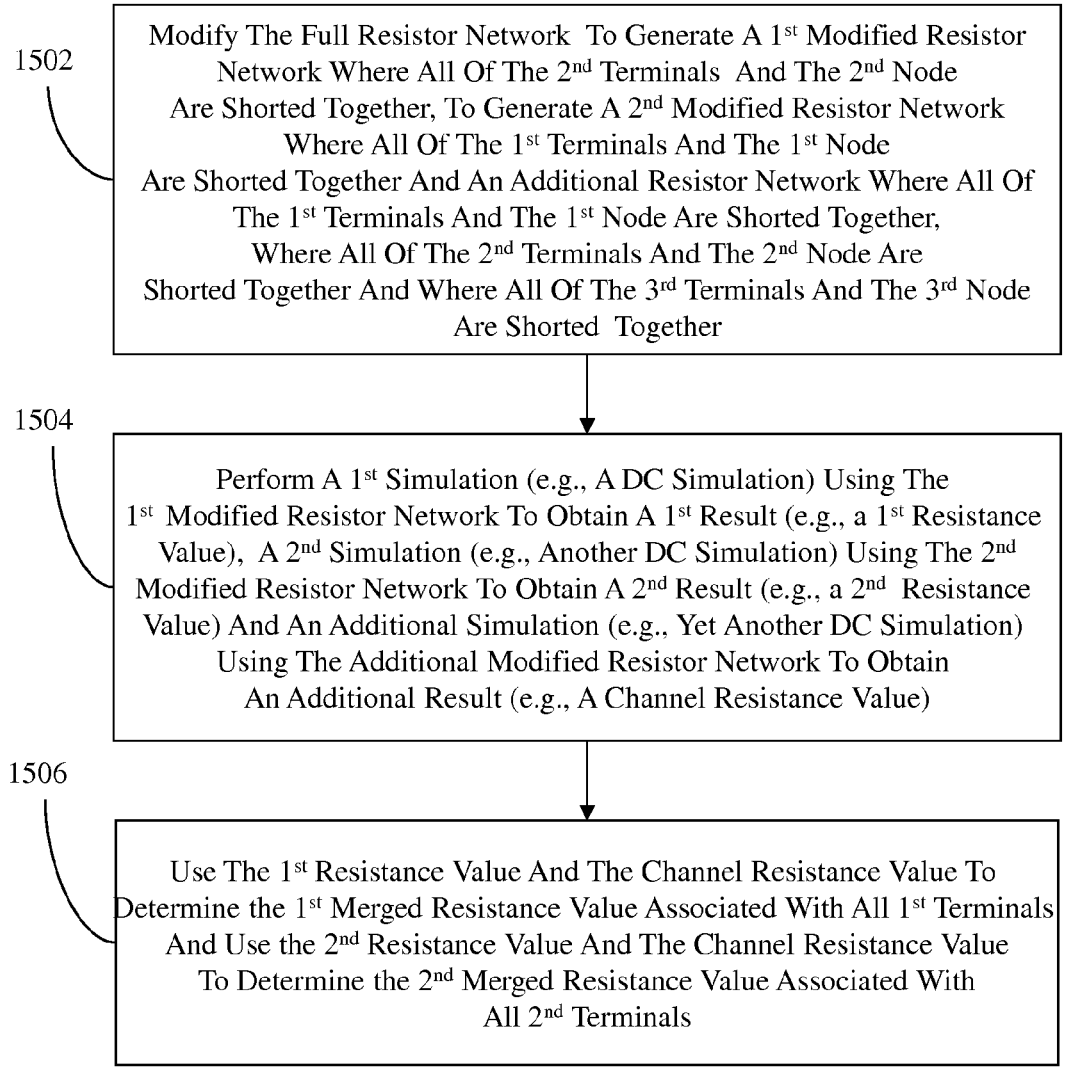
FIG. 15 is a flow diagram illustrating in greater detail processes, which can be used specifically to determine the first merged resistance value ($R_s$) and the second merged resistance value ($R_d$)

More specifically, FIG. 15 is a flow diagram illustrating in greater detail processes, which can be used specifically to determine the first merged resistance value ($R_s$) and the second merged resistance value ($R_d$). In this embodiment, the full resistor network and, particularly, the portion 500 of the full resistor network, as shown in FIG. 5, can be modified to generate a first modified resistor network 700, as shown in FIG. 7, wherein all of the second terminals 421-425 of the semiconductor devices 401-405 and the second node 452 (e.g., all of the drains and the drain node in the case of FETs) are electrically shorted together and a second modified resistor network 800, as shown in FIG. 8, wherein all of the first terminals 411-415 of the semiconductor devices 401-405 and the first node 451 (e.g., all of the sources and the source node in the case of FETs) are electrically shorted together (1502). Shorting of the first terminals 411-415 and the first node 451 in the second modified resistor network 800 of FIG. 8 can be represented by a first zero-resistance connector 851 and, similarly, shorting of the second terminals 421-425 and the second node 452 in the first modified resistor network 700 of FIG. 7 can be represented by a second zero-resistance connector 752. Additionally, the full resistor network and, particularly, the portion 500 of the full resistor network, as shown in FIG. 5, can be modified to generate an additional modified resistor network 900, as shown in FIG. 9, wherein all of the first terminals 411-415 (i.e., the sources) and the first node 451 (i.e., the source node) are electrically shorted together (e.g., as represented by a first zero-resistance connector 951), all of the second terminals 421-425 (i.e., the drains) and the second node 452 (i.e., the drain node) are electrically shorted together (e.g., as represented by the second zero-resistance connector 952), and all third terminals 431-435 (i.e., the gates) and the third node 453 (i.e., the gate node) are electrically shorted together (e.g., as represented by the third zero-resistance connector 953) (1502).

In this case, a first simulation can be performed using the first modified resistor network 700 of FIG. 7 to obtain the first result, a second simulation can be performed using the second modified resistor network 800 of FIG. 8 to obtain the second result, and an additional simulation can be performed using the additional modified resistor network 900 of FIG. 9 to obtain an additional result (1504). The first simulation, second simulation and additional simulation can all comprise DC simulations and these DC simulations can be performed such that the first result of the first simulation comprises a first resistance value ($R_1$) in the absence of second terminal resistance (i.e., a source plus channel resistance value in the absence of drain resistance or, more particularly, the resistance between the second internal terminals 421-425 and the first node 451, as shown in FIG. 7), such that the second result of the second simulation comprises a second resistance value ($R_2$) in the absence of first terminal resistance (i.e., a drain plus channel resistance value in the absence of source resistance or, more particularly, the resistance between the zero-resistance connector 851 at the first terminals and the second node 452, as shown in FIG. 8) and such that the additional result of the additional simulation comprises an additional resistance value ($R_{ch}$) in the absence of first, second and third terminal resistances (i.e., a channel resistance value in the absence of source, drain and gate resistances).

The first resistance value ($R_1$) can be equal to a ratio of the voltage difference between the second terminals 421-425 and the first node 451 (i.e., the drain voltage ($V_d$–$V_{source}$)) to a first current value ($I_1$) (e.g., a first overdrive linear current I(od, lin)$_1$) obtained specifically when none of resistance beyond the second terminals 421-425 (i.e., beyond the drains) is included in the current paths. That is, the first resistance value ($R_1$) can be determined using equation (1) above. Similarly, the second resistance value ($R_2$) can be equal to a ratio of the voltage difference between the second node 452 and the first terminals 411-415 (i.e., the drain voltage ($V_{drain}$–$V_s$)) to a second current value ($I_2$) (e.g., a second overdrive linear current I(od, lin)$_2$) obtained when none of resistance beyond the first terminals 411-415 (i.e., beyond the internal sources) is included in current paths. That is, the second resistance value ($R_2$) can be determined using equation (2) above. The additional resistance value ($R_{ch}$) (i.e., the channel resistance value) can comprise, for example, a ratio of the voltage difference between the second terminals 421-425 and the first terminals 411-415 (i.e., the drain voltage ($V_d$–$V_s$)) to an additional current value ($I_a$) (e.g., an additional overdrive linear current I(od, lin)$_a$) obtained when none of resistance beyond the first terminals 411-415 (i.e., beyond the internal sources) or beyond the second terminals 421-425 (i.e., beyond the internal drains) is included in current paths. That is, the additional resistance value ($R_{ch}$) can be determined using equation (3) above.

As mentioned above with regard to the system 100, for purposes of this disclosure, overdrive linear or (od, lin) describes parameters wherein the voltage difference between the third terminals 431-435 and the first terminals 411-415 of the semiconductor devices 401-405 (i.e., the voltage difference between the gate voltage and the source voltage ($V_g$–$V_s$)) is set at to achieve an overdrive condition, also referred to herein the device-turned-on condition, and the voltage difference between the second terminals 421-425 and the first terminals 411-415 of the semiconductor devices 401-405 (i.e., the voltage difference between the drain voltage and the source voltage ($V_d$–$V_s$)) is set in to achieve a linear condition wherein the current-voltage (I-V) behavior between the second terminals and the first terminals is linear. For example, in order to achieve the overdrive condition, voltages at the first node 451, second node 452 and third node 453 (i.e., $V_{source}$, $V_{drain}$ and $V_{gate}$, respectively) can be set such that the voltage difference between the third node 453 and the first node 451 (i.e., $V_{gate}$–$V_{source}$) is, for example, at around $V_{dd}$ or the circuit/device's power supply voltage. Additionally, in order to achieve the linear condition, the voltages at the first node 451, second node 452 and third node 453 (i.e., $V_{source}$, $V_{drain}$ and $V_{gate}$, respectively) can further be set such that the voltage difference between the second node 452 and the first node 451 (i.e., $V_{drain}$–$V_{source}$) is, for example, between 20 and 100 millivolts (e.g., 50 millivolts).

Once the first resistance value ($R_1$), the second resistance value ($R_2$) and the additional resistance value ($R_{ch}$) (i.e., the channel resistance value) are obtained, the first merged resistance value ($R_s$) associated with all of the first terminals 411-415 of the semiconductor devices 401-405 in the complex semiconductor structure 400 (i.e., a merged source resistance value) can be determined based on the first result (i.e., the first resistance value ($R_1$)) and the additional result (i.e., the additional resistance value and, particularly, the channel resistance value ($R_{ch}$)) using the equation (4) above and, additionally, the second merged resistance value ($R_d$) associated with all of the second terminals 421-425 of the semiconductor devices 401-405 in the complex semiconductor structure 400 (i.e., a merged drain resistance value) can be determined based on the second result (i.e., the second resistance value ($R_2$)) and the additional result (i.e., the additional resistance value and, particularly, the channel resistance value ($R_{ch}$)) using equation (5) above (1506).

Alternatively, instead of modifying the full resistor network to generate a first modified resistor network 700, as shown in FIG. 7, a second modified resistor network 800, as shown in FIG. 8, and an additional modified resistor network 900, as shown in FIG. 9 and performing the first, second and additional simulations described above in order to solve the equations (4) and (5) to determine the merged resistance values for the first terminals 411-415 and second terminals 421-425, respectively, as described above and illustrated in the flow diagram of FIG. 15, the full resistor network can be modified at process 1408 of FIG. 14 such that, within both the first modified resistor network and the second modified resistor network, the semiconductor devices are replaced by resistors, first and second simulations can be performed based using these modified resistor networks at process 1410 of FIG. 14 and the results can be used at process 1412 of FIG. 14 to determine the first merged resistance value ($R_s$) and the second merged resistance value ($R_d$).

Figure 16:
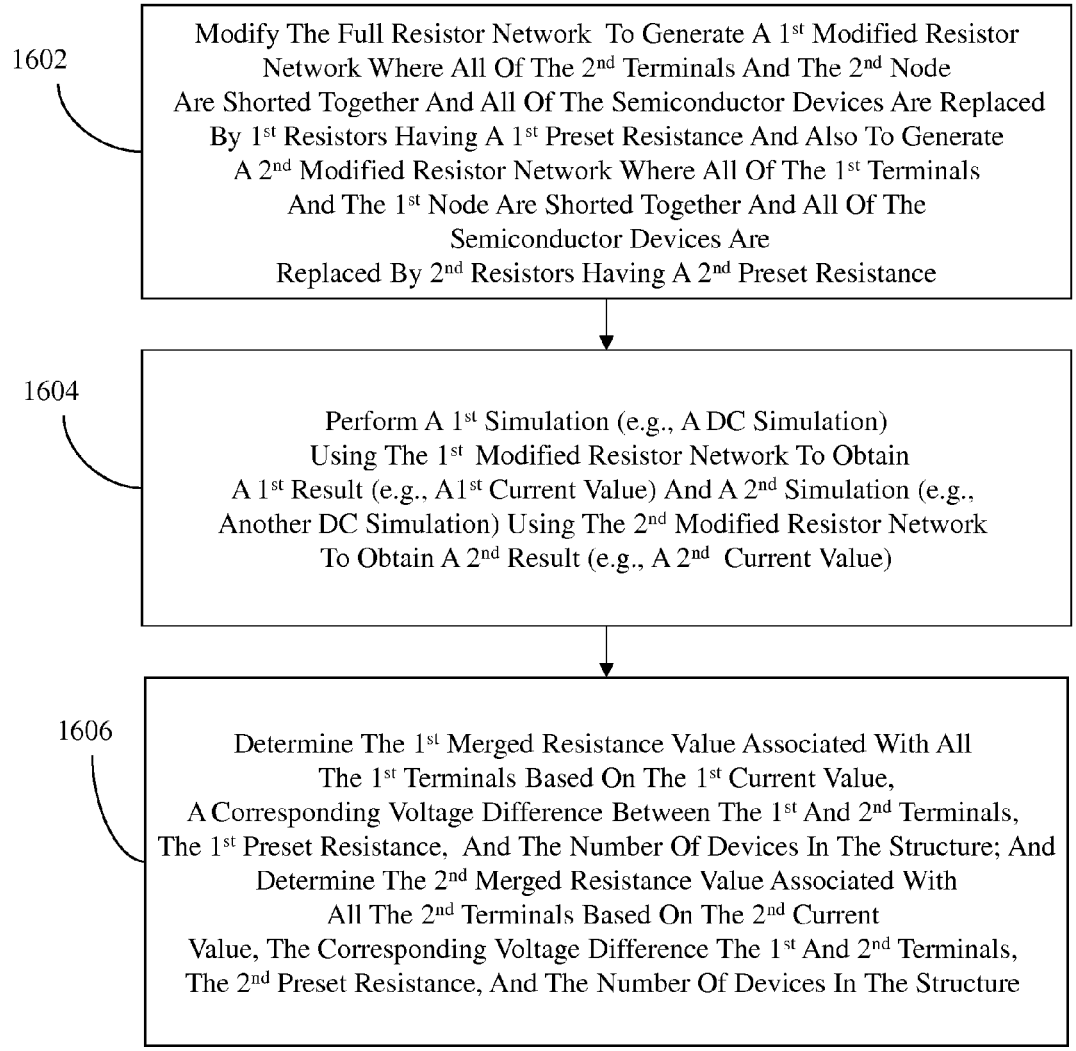
FIG. 16 is a flow diagram illustrating in greater detail alternative processes, which can be used to determine the first merged resistance value ($R_s$) and the second merged resistance value ($R_d$)

More specifically, FIG. 16 is a flow diagram illustrating in greater detail alternative processes, which can be used specifically to determine the first merged resistance value ($R_s$) and the second merged resistance value ($R_d$).

The full resistor network and, particularly, the portion 500 of the full resistive network as shown in FIG. 5 can be modified to generate a first modified resistor network 1000, as shown in FIG. 10, where not only are all of the second terminals 421-425 (i.e., all of the drains) of the semiconductor devices 401-405 and the second node 452 (i.e., the drain node) electrically shorted together (e.g., as represented by the second zero-resistance connector 1052), but where all of the semiconductor devices 401-405 are further replaced with first resistors 901-905 having a relatively large first preset resistance ($R_{1p}$) (1602). Each first resistor can connect the first and second terminals of the FET that it is replacing. For example, the first resistor 1001 can electrically connect the first terminal 411 (i.e., the source) and the second terminal 421 (i.e., the drain) of the FET 401 it is replacing, the first resistor 1002 can connect the first terminal 412 (i.e., the source) and the second terminal 422 (i.e., the drain) of the FET 402 it is replacing, and so on. The first preset resistance ($R_{1p}$) can be preset so that it is greater than an estimated maximum value (i.e., an estimated upper bound) for the first merged resistance value ($R_s$) (i.e., the merged source resistance value) multiplied by the total number of the semiconductor devices (m) in the complex semiconductor structure 400 and further multiplied by some additional number (e.g., 100, 1000, etc.). For example, the first preset resistance value ($R_{1p}$) can be preset so that it satisfies the expression (6) above.

Similarly, the full resistor network and, particularly, the portion 500 of the full resistive network as shown in FIG. 5 can be modified to generate a second modified resistor network 1100, as shown in FIG. 11, where not only are all of the first terminals 411-415 (i.e., all of the sources) of the semiconductor devices 401-405 and the first node 451 (i.e., the source node) electrically shorted (e.g., as represented by the first zero-resistance connector 1151), but all of the semiconductor devices 401-405 are further replaced with second resistors 1101-1105 having a relatively large second preset resistance ($R_{2p}$) (1602). Each second resistor can connect the first and second terminals of the FET that it is replacing. For example, the second resistor 1101 can electrically connect the first terminal 411 (i.e., the source) and the second terminal 421 (i.e., the drain) of the FET 401 it is replacing, the second resistor 1102 can connect the first terminal 412 (i.e., the source) and the second terminal 422 (i.e., the drain) of the FET 402 it is replacing, and so on. The second preset resistance ($R_{2p}$) can be preset so that it is greater than an estimated maximum value (i.e., an estimated upper bound) for the second merged resistance value ($R_d$) (i.e., the merged drain resistance value) multiplied by the total number of the semiconductor devices (m) in the complex semiconductor structure 400 and further multiplied by some additional number (e.g., 100, 1000, etc.). For example, the second preset resistance value ($R_{2p}$) can be preset so that it satisfies the expression (7) above.

It should be noted that the first terminals 411-415 in the second modified resistor network 1100 of FIG. 11 can be shorted together and shorted to the first node 451 such that none of resistance beyond the first terminals 411-425 (i.e., beyond the internal sources) is included in current paths and the second terminals 421-425 in the first modified resistor network 1000 of FIG. 10 can be shorted together and to the second node such that none of resistance beyond the second terminals 421-425 (i.e., beyond the internal drains) is included in the current paths.

In this case, a first simulation and, particularly, a first DC simulation can subsequently be performed using the first modified resistor network 1000 of FIG. 10 to obtain a first current value ($J_1$) specifically when none of resistance beyond the second terminals 421-425 (i.e., beyond the internal drains) is included in the current paths and a second simulation and, particularly, a second DC simulation can subsequently be performed using the second modified resistor network 1100 of FIG. 11 to obtain a second current value ($J_2$) specifically when none of resistance beyond the first terminals 411-415 (i.e., beyond the internal sources) is included in the current paths (1604).

This first current value ($J_1$) as well as a voltage difference between the voltage on the second terminals 421-425 ($V_d$) and the voltage at the source node ($V_{source}$), the first preset resistance ($R_{1p}$) and the total number of semiconductor devices (m) can then be used to determine the first merged resistance value ($R_s$) associated with all of the first terminals 411-415 of the semiconductor devices 401-405 in the complex semiconductor structure 400 (i.e., the merged source resistance value) (1606). Specifically, this first merged resistance value ($R_s$) (i.e., the merged source resistance value) can be determined using the equation (8) above. Similarly, the second current value ($J_2$) as well as a voltage difference between the voltage at the drain node ($V_{drain}$) and the voltage at the first terminals 411-415 ($V_s$), the second preset resistance ($R_{2p}$), and the total number of semiconductor devices (m) can be used at process 1606 to determine a second merged resistance value ($R_d$) associated with all of the second terminals 421-425 of the semiconductor devices 401-405 in the complex semiconductor structure 400 (i.e., a merged drain resistance value). Specifically, this second merged resistance value ($R_d$) (i.e., the merged drain resistance value) can be determined using the equation (9) above.

Regardless of which of the above described techniques illustrated in FIG. 15 or 16 above are used to ultimately determine the first merged resistance value ($R_s$) and the second merged resistance value ($R_d$), a third merged resistance value ($R_g$) associated with all of the third terminals 431-435 of the semiconductor devices 401-405 (i.e., all of the gates) must also be determined. To accomplish this, in one embodiment, before the third merged resistance value ($R_g$) can be determined, the full resistor network is also modified to generate an additional modified resistor network, wherein the first terminals 411-415 (i.e., the sources) and the first node 451 (i.e., the source node) are electrically shorted together, the second terminals 421-425 (i.e., the drains) and the second node 452 (i.e., the drain node) are electrically shorted together and the third terminals 431-435 (i.e., the gates) and the third node 453 (i.e., the gate node) are electrically shorted together, and an additional simulation is performed to obtain an additional result. This additional result along with the third result of the third simulation can be used to determine the third merged resistance value ($R_g$).

Figure 17:
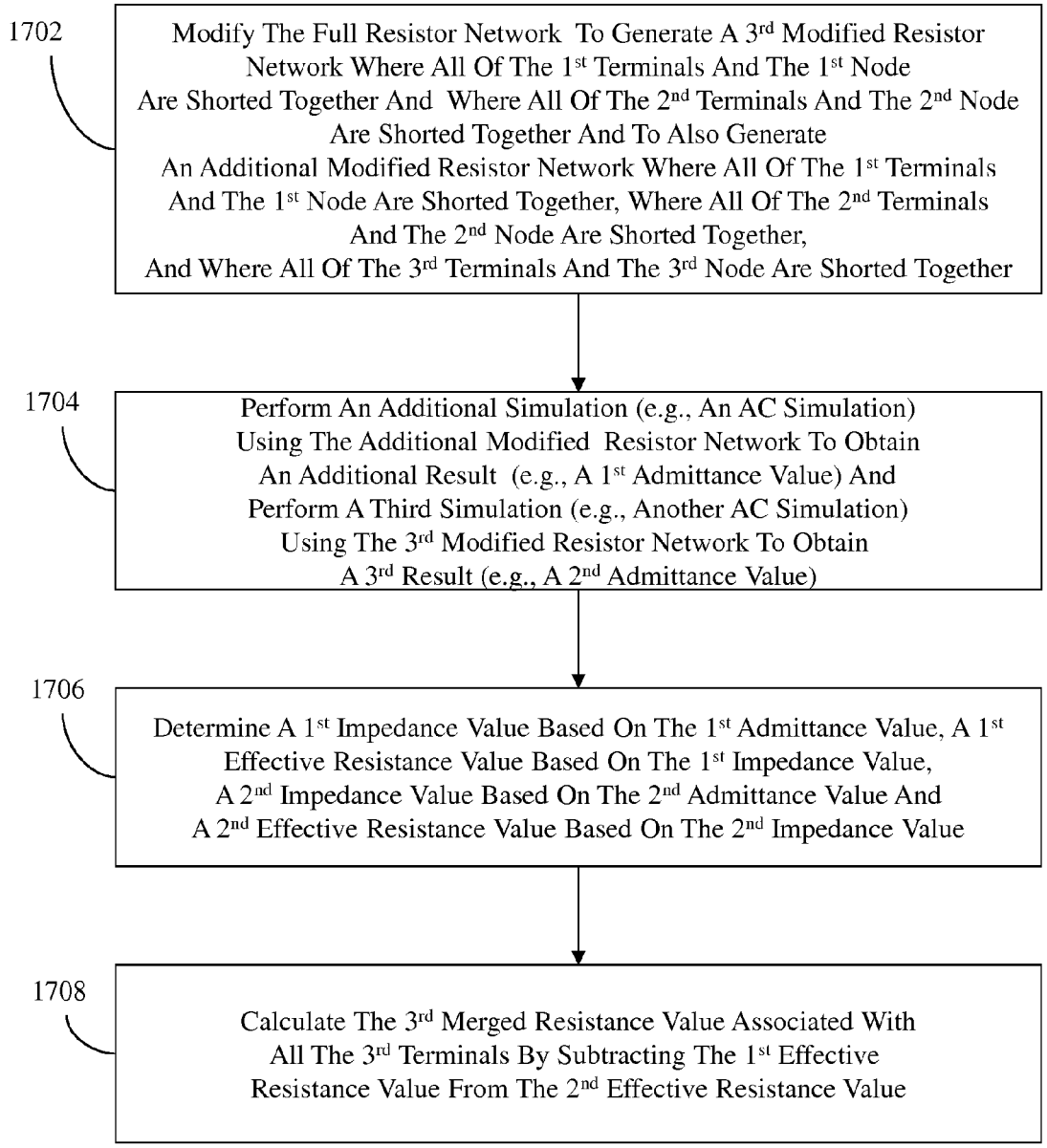
FIG. 17 is a flow diagram illustrating in greater detail processes, which can be used specifically to determine the third merged resistance value ($R_g$)

More specifically, FIG. 17 is a flow diagram illustrating in greater detail processes, which can be used specifically to determine the third merged resistance value ($R_g$). In this embodiment, the full resistor network and, particularly, the portion 600 of the full resistor network as shown in FIG. 6 is modified to generate a third modified resistor network 1200, as shown in FIG. 12, where all of the first terminals 411-415 (i.e., all of the sources) of the semiconductor devices 401-405 and the first node 451 (i.e., the source node) are electrically shorted together (e.g., as represented by the first zero-resistance connector 1251) and where all of the second terminals 421-425 (i.e., all of the drains) of all of the semiconductor devices 401-405 and the second node 452 (i.e., the drain node) are also electrically shorted together (e.g., as represented by the second zero-resistance connector 1252) (1702). Additionally, at process 1702, the full resistor network and, particularly, the portion 500 of the full resistor network, as shown in FIG. 5, is modified to generate an additional modified resistor network 900, as shown in FIG. 9, wherein all of the first terminals 411-415 (i.e., the sources) and the first node 451 (i.e., the source node) are electrically shorted together (e.g., as represented by the first zero-resistance connector 951), all of the second terminals 421-425 (i.e., the drains) and the second node 452 (i.e., the drain node) are electrically shorted together (e.g., as represented by the second zero-resistance connector 952), and all third terminals 431-435 (i.e., the gates) and the third node 453 (i.e., the gate node) are electrically shorted together (e.g., as represented by the third zero-resistance connector 953).

Additionally, an additional simulation and, particularly, an AC simulation can be performed using the additional modified resistor network 900, as shown in FIG. 9, to obtain an additional result (e.g., a first admittance value ($Y_1$) between (i) the third node and (ii) further shorted first and second nodes) and a third simulation and, particularly, another AC simulation can be performed using the third modified resistor network 1200, as shown in FIG. 12, to obtain a third result (e.g., a second admittance value ($Y_2$) between (i) the third node and (ii) further shorted first and second nodes) (1704). Then, a first impedance value ($Z_1$) can be determined, based on the first admittance value ($Y_1$), using the equation (10) above and a first effective resistance value ($R_{eff1}$) can be determined based on the first impedance value ($Z_1$) (1706). In this case, the first effective resistance value ($R_{eff1}$) can be identified as the real part (i.e., the resistance part) of the first impedance value ($Z_1$) and can equate to the intrinsic device resistance. Additionally, at process 1706, a second impedance value ($Z_2$) can be determined, based on the second admittance value ($Y_2$), using the equation (10) above, and a second effective resistance value ($R_{eff2}$) can be determined based on the second impedance value ($Z_2$). In this case, the second effective resistance value ($R_{eff2}$) can be identified as the real part (i.e., the resistance part) of the second impedance value ($Z_2$) and can equate to the sum of the intrinsic device resistance and the third merged resistance value ($R_g$) associated with the third terminals 431-435 (i.e., the gates). Finally, the third merged resistance value ($R_g$) associated with the third terminals 431-435 (i.e., the gates) can be calculated by subtracting the first effective resistance value ($R_{eff1}$) from the second effective resistance value ($R_{eff2}$) per equation (11) above (1708).

Alternatively, in another embodiment, instead of modifying the full resistor network to generate a third modified resistor network and an additional modified resistor network, performing discrete AC simulations using the third modified resistor network and the additional modified resistor network, respectively, and using the results of both of these simulations to determine the third merged resistance value ($R_g$), as discussed above and illustrated in FIG. 17, the full resistor network can be modified such that, within the third modified resistor network, the semiconductor devices are replaced by capacitors, the third simulation can be performed using on this third modified resistor network and the third merged resistance value can be determined based on the results of the third simulation.

Figure 18:
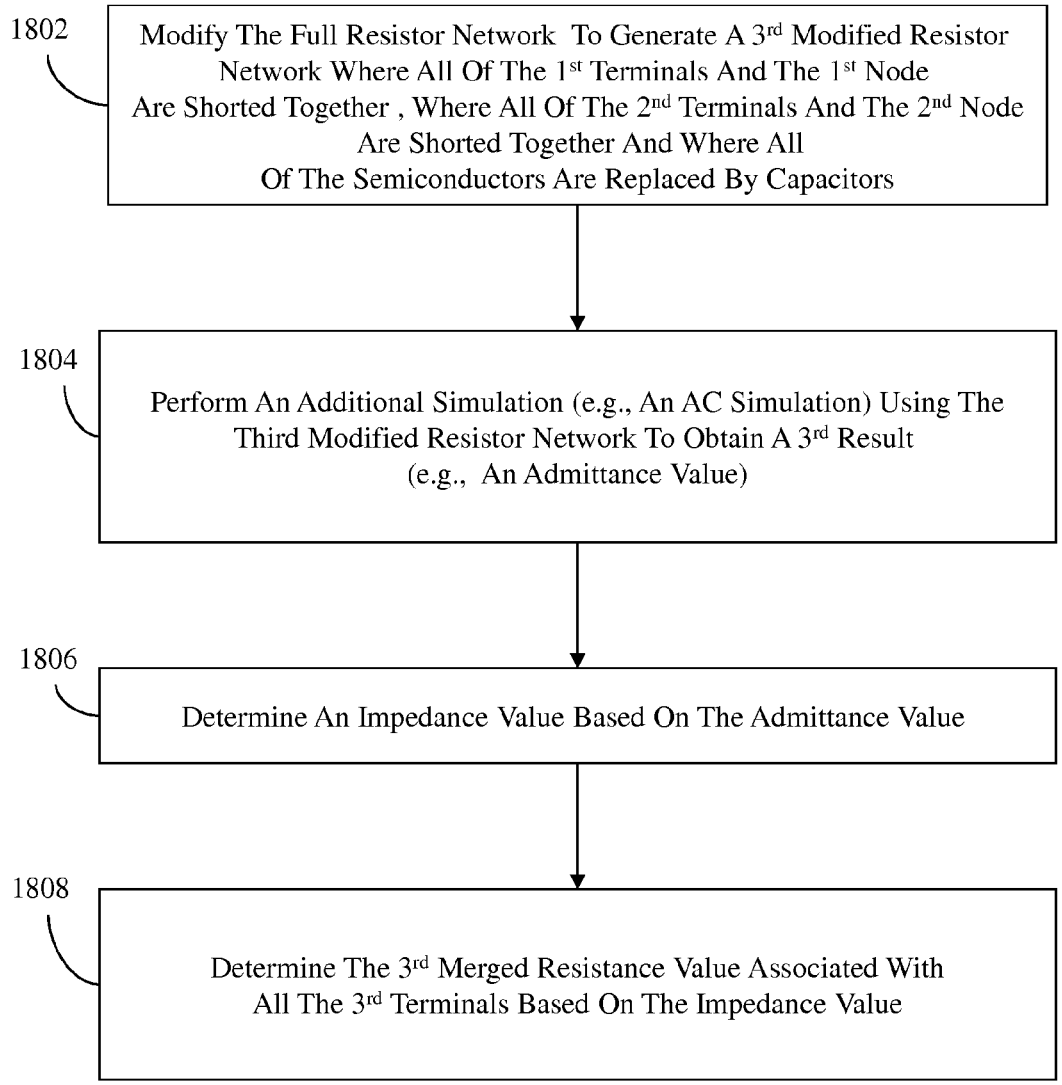
FIG. 18 is a flow diagram illustrating in greater detail alternative processes, which can be used specifically to determine the third merged resistance value ($R_g$)

More specifically, FIG. 18 is a flow diagram illustrating in greater detail alternative processes, which can be used specifically to determine the third merged resistance value ($R_g$). Specifically, the full resistor network and, particularly, the portion 600 of the full resistor network as shown in FIG. 6 can be modified to generate a third modified resistor network 1300, as shown in FIG. 13, where all of the first terminals 411-415 of the semiconductor devices 401-405 (i.e., all of the sources) and the first node 451 (i.e., the source node) are electrically shorted together (e.g., as represented by the first zero-resistance connector 1351), where all of the second terminals 421-425 of all of the semiconductor devices 401-405 (i.e., all of the drains) and the second node 452 (i.e., the drain node) are also electrically shorted together (e.g., as represented by the second zero-resistance connector 1352), and where all of the semiconductor devices 401-405 are replaced by (i.e., represented by) capacitors 1201-1205 (1802). Each capacitor can have one conductive plate electrically connected to a third terminal of the FET that it is replacing and another conductive plate electrically connected to the first and second terminals of the FET that it is replacing. For example, the capacitor 1301 can have a conductive plate connected to the third terminal 431 of the FET 401 that it is replacing and another conductive plate connected to the first and second terminals 411 and 421 of the FET 401 that it is replacing, the capacitor 1302 can have a conductive plate connected to the third terminal 432 of the FET 402 that it is replacing and another conductive plate connected to the first and second terminals 412 and 422 of the FET 402 that it is replacing, and so on. In this case, the capacitors 1201-1205 can have a preset capacitance equal to capacitance at the third terminals 431-435 of the semiconductor devices 401-405 (i.e., the gate capacitance) at a given, relatively, high bias (e.g., at a gate voltage ($V_{gate}$-$V_s$) equal to the positive supply voltage ($V_{dd}$)).

Once the third modified resistor network 1300, as shown in FIG. 13, is generated, a third simulation can be performed using the third modified resistor network 1300 to obtain a third result (1804). This third simulation can comprise an AC simulation and the third result can comprise an admittance value (Y). Based on this admittance value (Y), an impedance value (Z) can be determined using the equation (10) discussed above (1806). Then, the third merged resistance value ($R_g$) (i.e., a merged gate resistance value) associated with all of the third terminals 431-435 (i.e., all the gates) of the semiconductor devices 401-405 in the complex semiconductor structure 400 can be determined based on the impedance value (Z) (1808). In this case, the third merged resistance value ($R_g$) can be identified as the real part (i.e., the resistance part) of the impedance value (Z).

Once determined, these merged resistance values ($R_s$), ($R_d$) and ($R_g$) can subsequently be set as the resistance values for parasitic resistors connected to a simple semiconductor device in a merged netlist (e.g., such as that illustrated in FIG. 2 and described above) representative of the complex semiconductor structure and this merged netlist can be used to generate a provisional performance model for an integrated circuit that incorporates the complex semiconductor structure to enable faster integrated circuit simulations and model development without any loss of accuracy.

It should be noted that in the embodiments described above, the simulations can be performed at a first temperature (e.g., $T_1$=25° C.) and the required calculations can be performed to determine the merged resistance values as discussed. However, in order to provide a more accurate merged netlist, optionally, the simulations can further be repeated at one or more additional temperatures (e.g., a second temperature $T_2$=85° C., etc.) and the required calculations can be repeated to determine the merged resistance values at each of the additional temperatures (1413). After obtaining the merged resistance values at each of the additional temperatures, optimal merged resistance values for all temperatures can be determined given the results of the multiple simulations performed at the first temperature and at the one or more additional temperatures (1414). For example, these optimal merged resistance values can be determined by interpolation and extrapolation using the equation (12) above.

Also disclosed herein is a computer program product. This computer program product can comprise a computer readable storage medium, which stores instructions executable by a computer to perform the above-described method for determining merged resistance values of same-type terminals of multiple electrically connected multi-terminal semiconductor devices in a complex semiconductor structure. More specifically, as will be appreciated by one skilled in the art, aspects of the disclosed techniques for determining the terminal resistance values of a complex semiconductor device can be embodied as a method, system or computer program product. Accordingly, aspects of these techniques may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the disclosed techniques may take the form of a computer program product embodied in one or more computer readable medium(s) having computer readable program code embodied thereon.

Any combination of one or more computer readable medium(s) may be utilized. The computer readable medium may be a computer readable storage device or a computer readable signal medium. A computer readable storage medium is a tangible medium and may be, but is not limited to, any of the following: an electronic, magnetic, optical, electromagnetic, infrared, or semiconductor system, apparatus, or device, or any suitable combination of the foregoing. More specific examples (a non-exhaustive list) of the computer readable storage medium would include, but is not limited to, the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

As mentioned above, the computer readable medium can alternatively comprise a computer readable signal medium that includes a propagated data signal with computer readable program code embodied therein, for example, in baseband or as part of a carrier wave. Such a propagated signal may take any of a variety of forms, including, but not limited to, electromagnetic, optical, or any suitable combination thereof. This computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed method, system and computer program product are described above with reference to flowchart illustrations and/or block diagrams. It should be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

Figure 19:
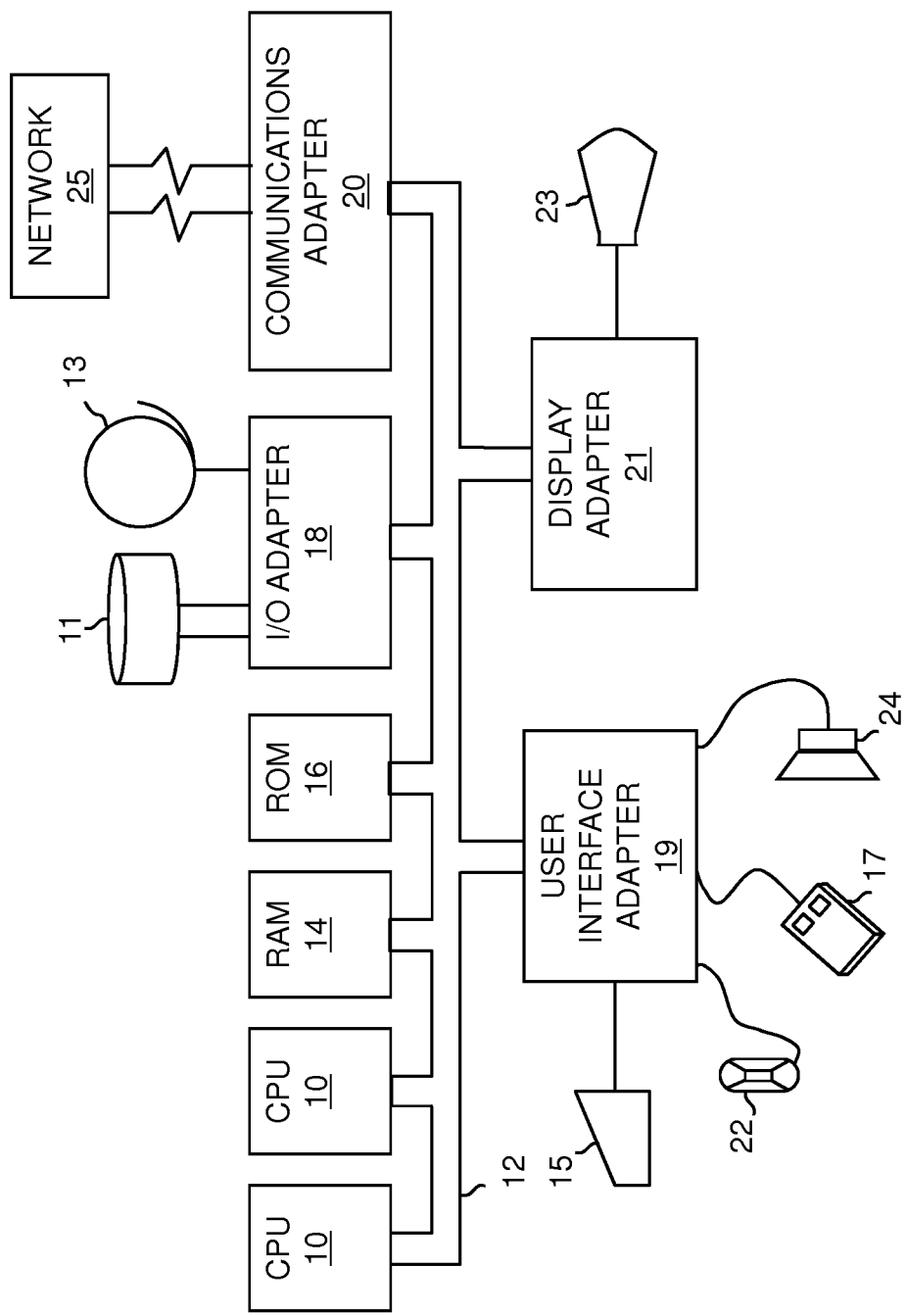
FIG. 19 is representative hardware environment that can be used to implement the disclosed system, method and/or computer program product.

FIG. 19 is representative hardware environment for implementing the above-disclosed system, method and/or computer program product. This schematic drawing illustrates a hardware configuration of a computerized device, such as an information handling/computer system. The computerized device comprises at least one processor or central processing unit (CPU) 10. The CPUs 10 are interconnected via bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the computerized device. The computerized device can read the inventive instructions on the program storage devices and follow these instructions to execute the methodology of the disclosed embodiments. The computerized device further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the flowcharts and block diagrams in the Figures referenced above illustrate the architecture, functionality, and operation of the various possible implementations of the above disclosed system, method and computer program product. In this regard, each block in the flowchart or block diagrams may represent a module, segment, or portion of code, which comprises one or more executable instructions for implementing the specified logical function(s). It should also be noted that, in some alternative implementations, the functions noted in any block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should also be noted that the terminology used herein is for the purpose of describing the system, method and computer program product and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including", specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed.

Therefore, disclosed above are a system, method and computer program product for determining merged resistance values of same-type terminals of multiple electrically connected multi-terminal semiconductor devices in a complex semiconductor structure. Specifically, the complex semiconductor structure can comprise multiple electrically connected field effect transistors (FETs) each having a first terminal (a source), a second terminal (a drain) and a third terminal (a gate). Alternatively, the complex semiconductor structure can comprise multiple electrically connected bipolar junction transistors (BJTs) each having a first terminal (an emitter), a second terminal (a collector) and a third terminal (a base). In any case, all of the first terminals of the semiconductor devices can be electrically connected to a same first node by first interconnects, all of the second terminals of the semiconductor devices can be electrically connected to a same second node by a second interconnects, and all of the third terminals of the semiconductor devices can be electrically connected to a same third node by a third interconnects. To determine the merged resistance values, multiple modified resistor networks can be generated based on a full resistor network for the structure including, but not limited to, a first modified resistor network where the second terminals of the semiconductor devices and the second node are electrically shorted; a second modified resistor network where the first terminals of the semiconductor devices and the first node are electrically shorted; and a third modified resistor network where the first terminals of the semiconductor devices and the first node are electrically shorted and where the second terminals of the semiconductor devices and the second node are also electrically shorted. Multiple simulations can be performed using these modified resistor networks. Based on the results of the simulations, a first merged resistance value associated with the first terminals of the devices, a second merged resistance value associated with the second terminals of the devices, and a third merged resistance value associated with the third terminals of the devices can be determined. These merged resistance values can subsequently be set as the resistance values for parasitic resistors connected to a simple semiconductor device in a merged netlist representative of the complex semiconductor structure and this merged netlist can be used to generate a provisional performance model for an integrated circuit that incorporates the complex semiconductor structure. Thus, the disclosed system, method and computer program product enable faster integrated circuit simulations and model development without any loss of accuracy.

The descriptions of the various embodiments of the present invention have been presented above for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
a memory storing a design for a complex semiconductor structure, said complex semiconductor structure comprising multiple electrically connected multi-terminal semiconductor devices having first terminals connected to a first node by first interconnects, second terminals connected to a second node by a second interconnects, and third terminals connected to a third node by a third interconnects; and
at least one processor accessing said design in said memory and comprising:
a parasitic extraction tool generating a full resistor network for said complex semiconductor structure and modifying said full resistor network multiple discrete times to generate at least a first modified resistor network wherein said second terminals and said second node are electrically shorted, a second modified resistor network wherein said first terminals and said first node are electrically shorted and a third modified resistor network wherein said first terminals and said first node are electrically shorted and said second terminals and said second node are electrically shorted; and
a simulation tool performing multiple simulations comprising at least a first simulation using said first modified resistor network to obtain a first result, a second simulation using said second modified resistor network to obtain a second result, and a third simulation using said third modified resistor network to obtain a third result, and
said simulation tool further determining a first merged resistance value associated with said first terminals based on said first result, a second merged resistance value associated with said second terminals based on said second result, and a third merged resistance value associated with said third terminals based on said third result.

2. The system of claim 1,
said parasitic extraction tool further modifying said full resistor network to generate an additional modified resistor network wherein said first terminals and said first node are electrically shorted, said second terminals and said second node are electrically shorted and said third terminals and said third node are electrically shorted, and
said simulation tool further performing an additional simulation using said additional modified resistor network to obtain an additional result,
said first simulation, said second simulation and said additional simulation comprising DC simulations and said first result comprising a first resistance value, said second result comprising a second resistance value, and said additional result comprising an additional resistance value, and said simulation tool further determining said first merged resistance value by subtracting said additional resistance value from said first resistance value and determining said second merged resistance value by subtracting said additional resistance value from said second resistance value.

3. The system of claim 2, said DC simulations performed with voltages set at said first node, said second node and said third node in order achieve both an overdrive condition and a linear condition.

4. The system of claim 1,
said simulation tool initially performing said multiple simulations using a first temperature such that said first merged resistance value, said second merged resistance value and said third resistance value are associated with said first temperature, and
said simulation tool further repeating said multiple simulations using at least one additional temperature in order to determine merged resistance values associated with said at least one additional temperature and determining optimal merged resistance values given results of said multiple simulations performed at said first temperature and said at least one additional temperature.

5. The system of claim 1,
said parasitic extraction tool modifying said full resistor network such that, within said first modified resistor network, said semiconductor devices are replaced with first resistors having a first preset resistance and such that, within said second modified resistor network, said semiconductor devices are replaced with second resistors having a second preset resistance,
said first simulation and said second simulation comprising DC simulations,
said first result comprising a first current value,
said second result comprising a second current value, and
said simulation tool determining said first merged resistance value based on a first voltage difference between said second terminals and said first terminals, said first current value, said first preset resistance and a total number of said semiconductor device and further determining said second merged resistance value based on a second voltage difference between said second terminals and said first terminals, said second current value, said second preset resistance and said total number of said semiconductor devices.

6. The system of claim 5,
said first preset resistance being preset so as to be greater than an estimated maximum value for said first merged resistance value multiplied by said total number of said semiconductor devices and further multiplied by an additional number, and
said second preset resistance being preset so as to be greater than an estimated maximum value for said second merged resistance value multiplied by said total number of said semiconductor devices and further multiplied by additional number.

7. The system of claim 1,
said parasitic extraction tool further modifying said full resistor network to generate an additional modified resistor network wherein said first terminals and said first node are electrically shorted, said second terminals and said second node are electrically shorted and said third terminals and said third node are electrically shorted, said simulation tool further performing an additional simulation using said additional modified resistor network to obtain an additional result, said additional simulation and said third simulation comprising AC simulations such that said additional result comprises a first admittance value and said third result comprises a second admittance value, said simulation tool further performing the following:
determining a first impedance value based on said first admittance value;
determining a first effective resistance value based on said first impedance value, said first effective resistance value being an intrinsic device resistance;
determining a second impedance value based on said second admittance value;
determining a second effective resistance value based on said second impedance value, said second effective resistance value being a sum of said intrinsic device resistance and said third merged resistance value associated with said third terminals; and
calculating said third merged resistance value by subtracting said first effect resistance value from said second effective resistance value.

8. The system of claim 1,
said parasitic extraction tool further modifying said full resistor network such that, within said third modified resistor network, said semiconductor devices are replaced by capacitors,
said third simulation comprising an AC simulation and said third result comprising an admittance value, and
said simulation tool further determining an impedance value based on said admittance value and, based on said impedance value, said third merged resistance value associated with said third terminals.

9. The system of claim 8, each of said capacitors having one conductive plate connected to a third terminal and another conductive plate connected to both a first terminal and a second terminal.

10. The system of claim 1, said semiconductor devices comprising any one of the following: field effect transistors with said first terminals comprising sources, said second terminals comprising drains and said third terminals comprising gates; and
bipolar junction transistors with said first terminals comprising emitters, said second terminals comprising collectors and said third terminals comprising bases.

11. A method comprising:
accessing, by a computer system, a design for a complex semiconductor structure, said complex semiconductor structure comprising multiple electrically connected multi-terminal semiconductor devices having first terminals connected to a first node by first interconnects, second terminals connected to a second node by a second interconnects, and third terminals connected to a third node by a third interconnects;
generating, by said computer system, a full resistor network for said complex semiconductor structure;
modifying, by said computer system, said full resistor network multiple discrete times to generate at least a first modified resistor network wherein said second terminals and said second node are electrically shorted, a second modified resistor network wherein said first terminals and said first node are electrically shorted and a third modified resistor network wherein said first terminals and said first node are electrically shorted and said second terminals and said second node are electrically shorted;

performing, by said computer system, multiple simulations comprising at least a first simulation using said first modified resistor network to obtain a first result, a second simulation using said second modified resistor network to obtain a second result, and a third simulation using said third modified resistor network to obtain a third result; and determining, by said computer system, a first merged resistance value associated with said first terminals based on said first result, a second merged resistance value associated with said second terminals based on said second result, and a third merged resistance value associated with said third terminals based on said third result.

12. The method of claim 11, said modifying of said full resistor network further being performed to generate an additional modified resistor network wherein said first terminals and said first node are electrically shorted, said second terminals and said second node are electrically shorted and said third terminals and said third node are electrically shorted, said performing of said multiple simulations further comprising performing an additional simulation using said additional modified resistor network to obtain an additional result, said first simulation, said second simulation and said additional simulation comprising DC simulations and said first result comprising a first resistance value, said second result comprising a second resistance value, and said additional result comprising an additional resistance value, said determining of said first merged resistance value comprising subtracting said additional resistance value from said first resistance value, and said determining of said second merged resistance value comprising subtracting said additional resistance value from said second resistance value.

13. The method of claim 12, said DC simulations performed with voltages set at said first node, said second node and said third node in order to achieve both an overdrive condition and a linear condition.

14. The method of claim 13, said multiple simulations initially being performed using a first temperature such that said first merged resistance value, said second merged resistance value and said third resistance value are associated with said first temperature, and said method further comprising repeating said multiple simulations using at least one additional temperature in order to determine merged resistance values associated with said at least one additional temperature and determining optimal merged resistance values given results of said multiple simulations performed at said first temperature and said at least one additional temperature.

15. The method of claim 11, said modifying of said full resistor network further being performed such that, within said first modified resistor network, said semiconductor devices are replaced with first resistors having a first preset resistance and such that, within said second modified resistor network, said semiconductor devices are replaced with second resistors having a second preset resistance, said first simulation and said second simulation comprising DC simulations, said first result comprising a first current value, said second result comprising a second current value, said first merged resistance value being determined based on a first voltage difference between said second terminals and said first terminals, said first current value, said first preset resistance and a total number of said semiconductor device, and said second merged resistance value being determined based on a second voltage difference between said second terminals and said first terminals, said second current value, said second preset resistance and said total number of said semiconductor devices.

16. The method of claim 15, said first preset resistance being preset so as to be greater than an estimated maximum value for said first merged resistance value multiplied by said total number of said semiconductor devices and further multiplied by an additional number, and said second preset resistance being preset so as to be greater than an estimated maximum value for said second merged resistance value multiplied by said total number of said semiconductor devices and further multiplied by additional number.

17. The method of claim 11, said modifying of said full resistor network further being performed to generate an additional modified resistor network wherein said first terminals and said first node are electrically shorted, said second terminals and said second node are electrically shorted and said third terminals and said third node are electrically shorted, said performing of said multiple simulations further comprising performing an additional simulation using said additional modified resistor network to obtain an additional result, said additional simulation and said third simulation comprising AC simulations such that said additional result comprises a first admittance value and said third result comprises a second admittance value, and said method further comprising:
  determining a first impedance value based on said first admittance value;
  determining a first effective resistance value based on said first impedance value, said first effective resistance value being an intrinsic device resistance;
  determining a second impedance value based on said second admittance value;
  determining a second effective resistance value based on said second impedance value, said second effective resistance value being a sum of said intrinsic device resistance and said third merged resistance value associated with said third terminals; and
  calculating said third merged resistance value by subtracting said first effect resistance value from said second effective resistance value.

18. The method of claim 11, said modifying of said full resistor network being performed such that, within said third modified resistor network, said semiconductor devices are replaced by capacitors, said third simulation comprising an AC simulation and said third result comprising an admittance value, and said method further comprising determining an impedance value based on said admittance value and determining said third merged resistance value associated with said third terminals, based on said impedance value.

19. The method of claim 11, said semiconductor devices comprising any one of the following:
  field effect transistors with said first terminals comprising sources, said second terminals comprising drains and said third terminals comprising gates; and bipolar junction transistors with said first terminals comprising emitters, said second terminals comprising collectors and said third terminals comprising bases.

20. A non-transitory computer program product comprising a computer readable storage medium, said computer readable storage medium storing instructions executable by a computer to perform a method comprising:

accessing a design for a complex semiconductor structure, said complex semiconductor structure comprising multiple electrically connected multi-terminal semiconductor devices having first terminals connected to a first node by first interconnects, second terminals connected to a second node by a second interconnects, and third terminals connected to a third node by a third interconnects;

generating a full resistor network for said complex semiconductor structure;

modifying said full resistor network multiple discrete times to generate at least a first modified resistor network wherein said second terminals and said second node are electrically shorted, a second modified resistor network wherein said first terminals and said first node are electrically shorted and a third modified resistor network wherein said first terminals and said first node are electrically shorted and said second terminals and said second node are electrically shorted;

performing multiple simulations comprising at least a first simulation using said first modified resistor network to obtain a first result, a second simulation using said second modified resistor network to obtain a second result, and a third simulation using said third modified resistor network to obtain a third result; and determining a first merged resistance value associated with said first terminals based on said first result, a second merged resistance value associated with said second terminals based on said second result, and a third merged resistance value associated with said third terminals based on said third result.

* * * * *